US008564355B2

(12) United States Patent
Tani et al.

(10) Patent No.: US 8,564,355 B2
(45) Date of Patent: Oct. 22, 2013

(54) CLOCK DEVICE

(75) Inventors: Shigeo Tani, Osaka (JP); Takashi Umegaki, Osaka (JP)

(73) Assignee: Fujitsu Limited, Kawasaki (JP)

( * ) Notice: Subject to any disclaimer, the term of this patent is extended or adjusted under 35 U.S.C. 154(b) by 57 days.

(21) Appl. No.: 13/004,438

(22) Filed: Jan. 11, 2011

(65) Prior Publication Data
US 2011/0175653 A1    Jul. 21, 2011

(30) Foreign Application Priority Data
Jan. 18, 2010    (JP) .................................. 2010-007931

(51) Int. Cl.
*H03K 3/00*    (2006.01)

(52) U.S. Cl.
USPC .......................................... 327/295; 327/156

(58) Field of Classification Search
USPC .......................... 327/156–159, 147–148, 291
See application file for complete search history.

(56) References Cited

U.S. PATENT DOCUMENTS

| | | | |
|---|---|---|---|
| 5,619,532 A * | 4/1997 | Tani et al. ..................... | 375/224 |
| 6,163,224 A | 12/2000 | Araki et al. | |
| 2001/0043098 A1* | 11/2001 | Locker et al. ................. | 327/156 |

FOREIGN PATENT DOCUMENTS

| | | |
|---|---|---|
| JP | 1-200442 A | 8/1989 |
| JP | 2-190944 A | 7/1990 |
| JP | 3-259463 A | 11/1991 |
| JP | 4-154220 A | 5/1992 |
| JP | 2000-68825 A | 3/2000 |
| JP | 2007-166003 A | 6/2007 |
| JP | 2009-278596 A | 11/2009 |

OTHER PUBLICATIONS

Japanese Office Action mailed Aug. 13, 2013 for corresponding Japanese Application No. 2010-007931, with Partial English-language Translation.

* cited by examiner

*Primary Examiner* — Lincoln Donovan
*Assistant Examiner* — Diana J Cheng
(74) *Attorney, Agent, or Firm* — Fujitsu Patent Center

(57) ABSTRACT

There is provided a clock device including: a clock circuit to generate a plurality of clock signals, the clock circuit including a reset part for resetting generation of the clock signals; and a peripheral circuit operating based on the clock signals generated from the clock circuit, the peripheral circuit including: an error detection part for detecting an error in a process performed in the peripheral circuit by using the clock signals, and a determination part for determining whether to reset the clock circuit, based on information of the error detected by the error detection part.

7 Claims, 22 Drawing Sheets

FIG. 9
[ DETECTION OF INTERRUPTION DETECTION STATE ]
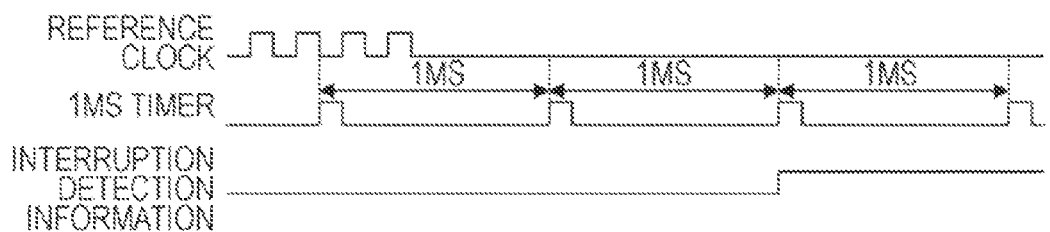
[ DETECTION OF STATE WITH NO INTERRUPTION DETECTED ]
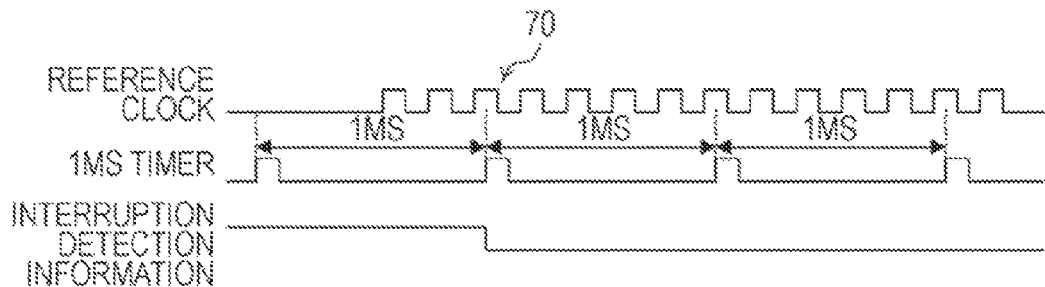

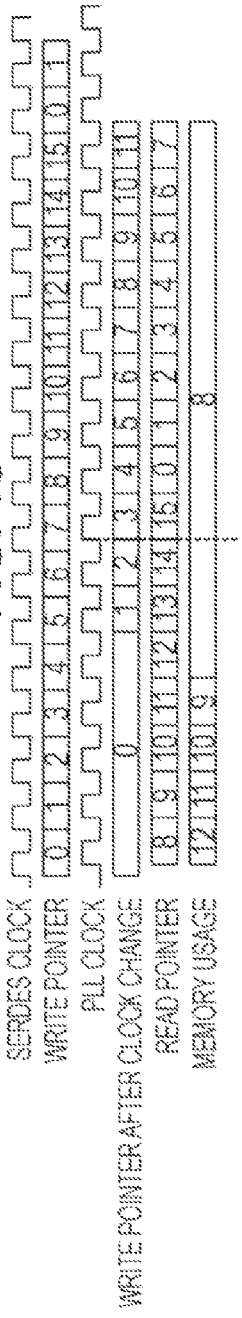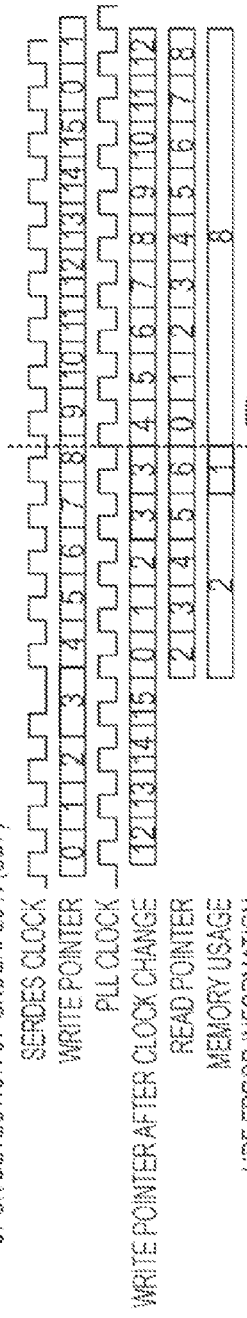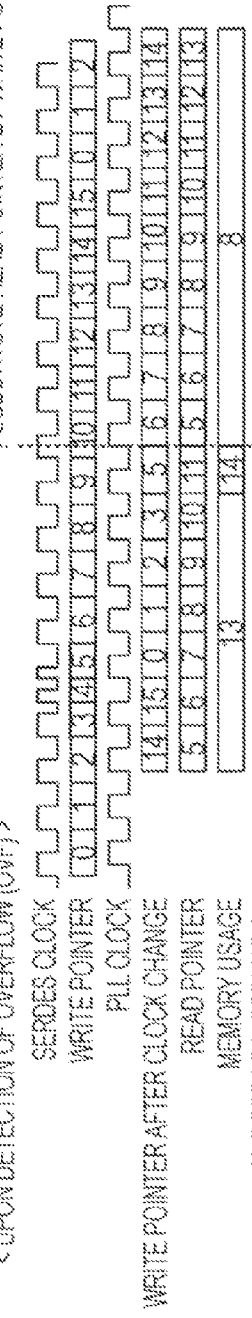
FIG. 16

RELATED ART
FIG. 21
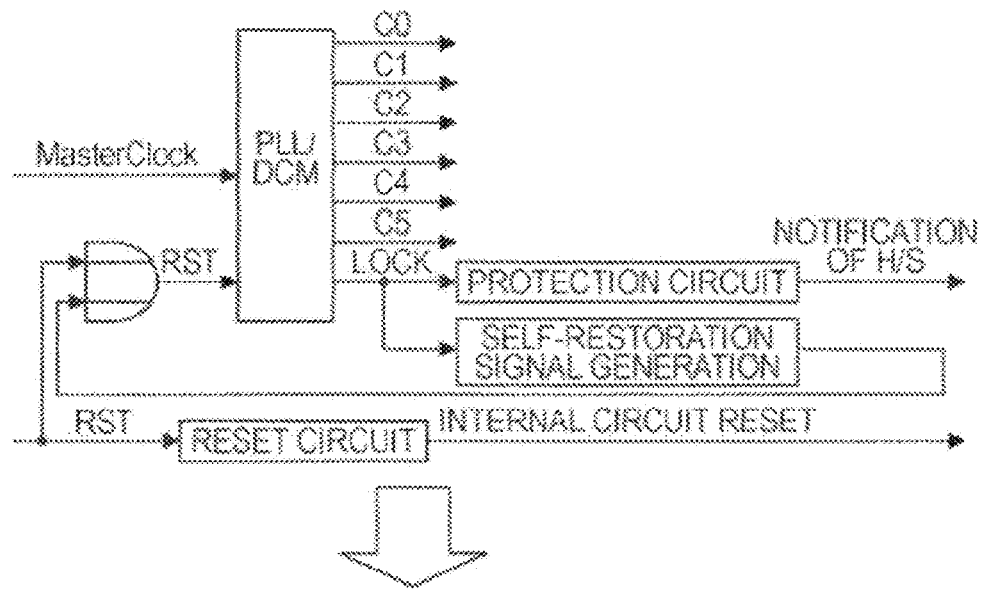
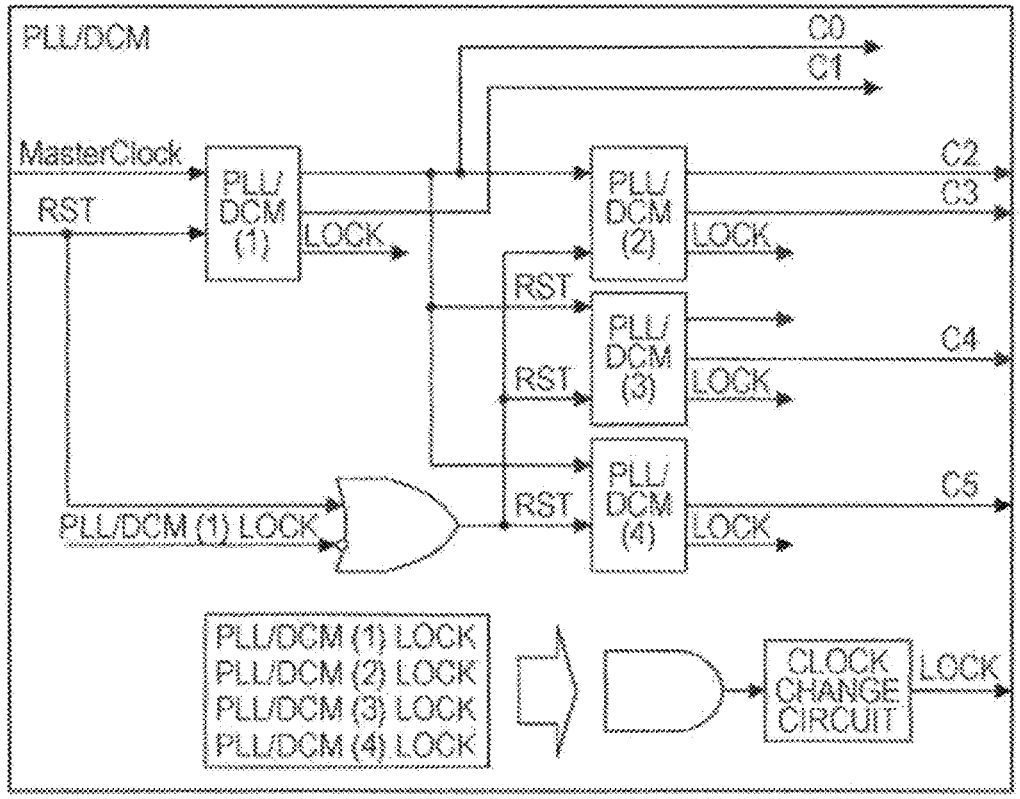

CLOCK DEVICE

CROSS-REFERENCE TO RELATED APPLICATION

This application is based upon and claims the benefit of priority of the prior Japanese Patent Application No. 2010-007931, filed on Jan. 18, 2010, the entire contents of which are incorporated herein by reference.

FIELD

The embodiments discussed herein are related to a clock device having the reset of phase-locked loops (PLLs).

BACKGROUND

In recent product development, field programmable gate arrays (FPGAs) which are easy in design variation are often used at the development stage, and functions implemented by the FPGAs are often replaced with application specific integrated circuits (ASICs) that are low in cost and high in speed for the mass production. In order to achieve effective replacement, the products are preferably designed to be suitable for the future replacement with ASICs during the development process.

In some cases, however, the FPGAs may be replaced with newly developed devices other than the ASICs intended for the replacement during the development process. The FPGAs may also be replaced with lower-cost alternatives. The replacement may require some design changes in accordance with characteristics of the devices to replace with. Such design changes usually include redesign and verification of the products in accordance with the characteristics of the newly developed devices in order to guarantee the quality of the products. For example, a PLL which outputs a plurality of clock signals may be replaced with a plurality of lower-cost PLLs each of which outputs only a single clock signal.

FIG. 21 illustrates an exemplary configuration of a PLL which outputs a plurality of clocks. That is, an example of replacement of a phase-locked loop/digital clock management (PLL/DCM; hereinafter, simply referred to as "PLL") which outputs six clock signals (C0 to C5) with a PLL circuit which outputs six clock signals and is constituted by four serially-connected PLLs each of which outputs a clock signal. However, direct replacement with the PLL circuit may cause problems.

A technique of controlling problems caused by serially-connected PLLs, for example, an occurrence of abnormal clock signals upon resetting or turning-on, has been proposed (see, for example, Japanese Laid-open Patent Publication No. 2007-166003).

In a structure in which a PLL which outputs six clock signals is replaced directly with a PLL circuit constituted by serially-connected PLLs as illustrated in FIG. 21, however, it is possible that the PLLs might not be reset automatically at appropriate times. It is important to reset PLLs at appropriate times for those products which are desirably reset automatically without any suspension of the operation, for example, products used for communication systems.

The PLLs are reset at those times determined by monitoring lock signals output from the PLLs. The lock signal is a signal indicating the stability of the PLL, indicating whether the PLL is in a locked state or not. The lock signals of the PLL circuit are generated from each of the lock signals output from the plurality of PLLs constituting the PLL circuit. Thus, the lock signals of the PLL circuit are not always properly output due to an indefinite length of the lock signals output from each of the PLLs.

SUMMARY

According to an aspect of the embodiment, there is provided a clock device including: a clock circuit to generate a plurality of clock signals, the clock circuit including a reset part for resetting generation of the clock signals; and a peripheral circuit operating based on the clock signals generated from the clock circuit, the peripheral circuit including: an error detection part for detecting an error in a process performed in the peripheral circuit by using the clock signals, and a determination part for determining whether to reset the clock circuit, based on information of the error detected by the error detection part.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 9 illustrates timing diagrams of the clock interruption detection circuit;

FIG. 16 illustrates timing diagrams of the internal processing section;

FIG. 21 illustrates an exemplary configuration of a PLL which outputs a plurality of clocks.

DESCRIPTION OF EMBODIMENT

Embodiment

A clock device of the present embodiment outputs a plurality of clock signals and resets PLLs at appropriate times regardless of the characteristics of the PLLs included in the clock device.

In some situations, for example, a FPGA developed with certain functions might not be replaced with PLLs having the same characteristics as those of the developed FPGA. Such situations usually require redesign and verification of the products in accordance with the characteristics of the alternative PLLs in order to guarantee the quality of the products.

With the clock device of the present embodiment, however, the PLL can be replaced with the alternative PLLs without the need of redesign and verification in accordance with the characteristics of the alternative PLLs. It is only necessary to check the connection and the frequency of the alternative PLLs.

This is because the clock device of the present embodiment is provided with a mechanism taking account of differences of the characteristics of various PLLs. In particular, the clock device resets the PLLs upon occurrence of an abnormality in the PLLs themselves and also resets the PLLs on the basis of states of processing circuits operating based on clock signals output from the PLLs. The clock device has a resetting sequence which is applicable to various PLLs. The clock device also resets the PLLs upon detection of an abnormality in reference clocks thereof. Glitches of the lock signals output from the clock device are avoided for the improvement in reliability.

Hereinafter, the clock device of the present embodiment will be described with reference to FIG. 21. FIG. 21 illustrates an example in a PLL circuit constituted by a single PLL which outputs a plurality of clock signals is replaced with a PLL circuit constituted by a plurality of serially-connected PLLs each of which outputs a single clock signal. The PLL circuit may be constituted by a plurality of PLLs when the number of necessary output ports of the PLL circuit differs from that of the output ports of the PLLs. The shift setting of clock phases often varies depending on the devices.

Figure 1:
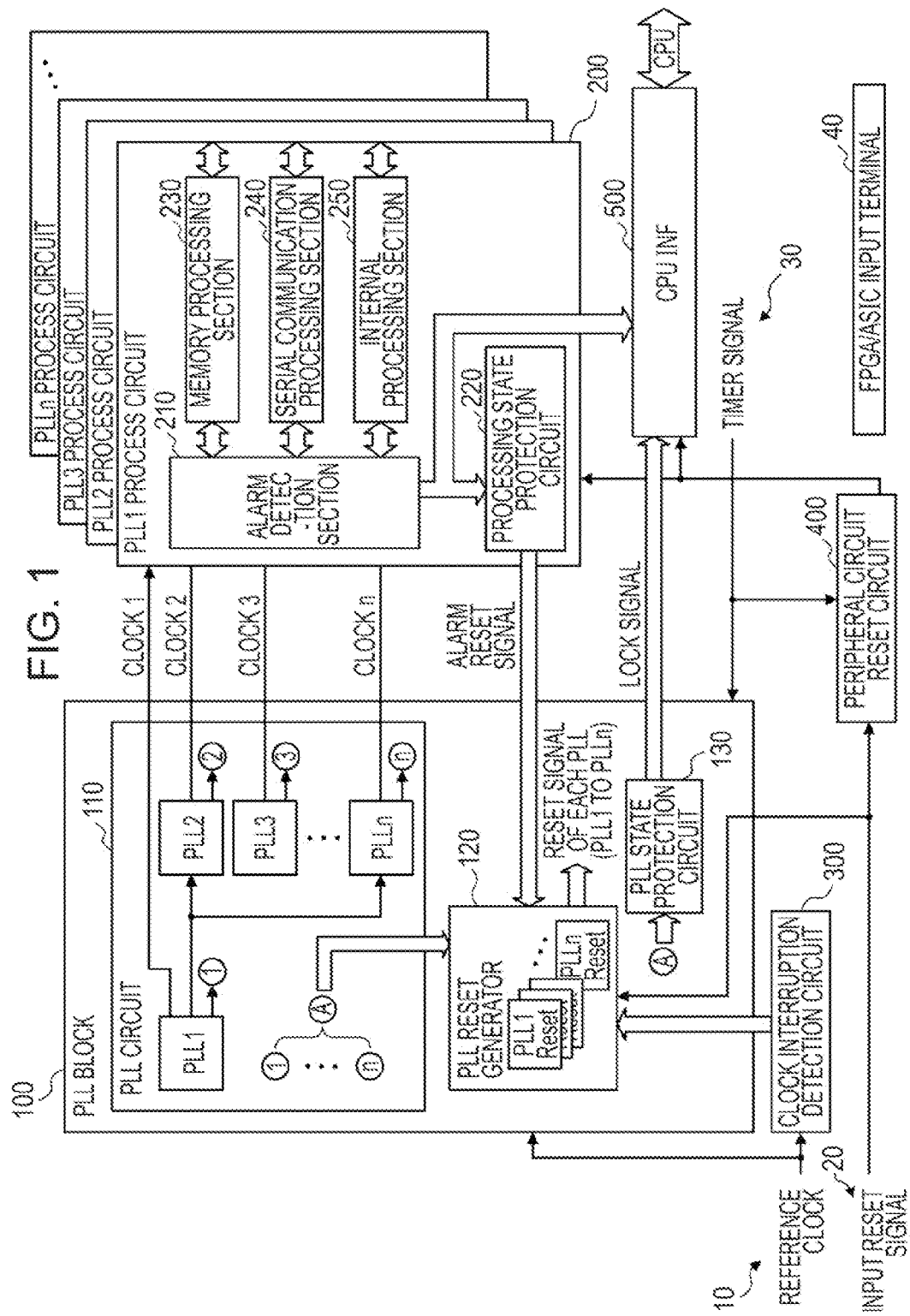
FIG. 1 illustrates an exemplary functional structure of a clock device.

FIG. 1 is a block diagram of an exemplary functional structure of the clock device. The clock device includes a PLL block 100 and circuits for detecting states around the PLL block 100. In particular, the circuits for detecting the states around the PLL block 100 include a clock interruption detection circuit 300 and a processing state protection circuit 220.

The PLL block 100 includes a PLL circuit 110, a PLL reset generator 120 and a PLL state protection circuit 130.

The PLL circuit 110 includes PLL 1 to PLL n each of which outputs clock 1 to clock n from the PLL block 100. Each of the PLLs has an ordinary function as a PLL and outputs clock signals and state signals representing its own state (see circled numbers 1 to n). In the PLL circuit 110 illustrated in FIG. 1, the PLL 1 inputs a reference clock 10, outputs one clock as a clock of the PLL block 100 and outputs one clock as reference clocks of the subsequent PLL 2 to PLL n.

The PLL reset generator 120 has a function to reset the PLL 1 to PLL n. The PLL reset generator 120 includes a PLL 1 reset to a PLL n reset each of which generates a reset signal for the PLL 1 to PLL n.

The PLL reset generator 120 resets the PLLs: upon starting of the device on the basis of an external instruction from an input reset signal 20; upon interruption of the reference clock notified from the clock interruption detection circuit 300; on the basis of alarm information from the processing state protection circuit 220; and on the basis of information representing states of the PLLs themselves. The PLL reset generator 120 has a specific reset operation of which details will be described in the later section regarding the PLL reset generator.

The state signals of the PLL 1 to the PLL n are input to the PLL state protection circuit 130, which then outputs the lock signal of the PLL block 100. Note that each of the PLLs includes its own PLL state protection circuit, which will be collectively referred to as the PLL state protection circuit 130. Details of the PLL state protection circuit 130 will be described in the later section regarding the PLL state protection circuit.

With the PLL state protection circuit 130, false detection of the lock signals can be avoided even if, for example, a PLL circuit with glitches of the lock signals upon deterioration in states or upon restoration is employed for the replacement, whereby the PLLs might be reset at appropriate times.

The lock signals output from the PLL state protection circuit 130 are stored in a CPU INF 500 as a history of the states of the PLL block 100. The CPU INF 500 is cleared when being read from the CPU. Keeping the history enables a user to recognize the state of the clock device. For example, since parts with failures specific to the device can be precisely located on the basis of the history, such as an error history, products of high quality can be provided in a short time.

The clock interruption detection circuit 300 monitors the state of the reference clock 10 and, upon detection of a state of clock interruption, notifies the PLL reset generator 120 of the detected state. With this, even if, for example, a PLL circuit for which an alarm to instantaneous interruption of the reference clock is not sometimes detected is employed for the replacement, the PLLs can still be reset at appropriate times.

The processing state protection circuit 220 has a function to notify the PLL reset generator 120 of the alarm information of predetermined processes. The predetermined processes include various processes performed on the basis of the input clock 1 to clock n output from the PLL block 100. In the present embodiment, the PLL 1 process circuit 200 which operates on the basis of the input clock 1 will be described as an example.

The PLL 1 process circuit 200 includes a memory processing section 230, a serial communication processing section 240 and an internal processing section 250. The memory processing section 230 checks the stored data. The serial communication processing section 240 takes serial data in. The internal processing section 250 stores received data in internal memory and then readouts the stored data in synchronization with the predetermined clock.

The alarm detection section 210 detects errors in the process performed by the processing sections, such as the memory processing section 230, and notifies the CPU INF 500 and the processing state protection circuit 220 of the detected errors. The processing state protection circuit 220, referred to a determination part, outputs the alarm reset signal to the PLL reset generator 120 as needed and resets the PLLs. Details of the PLL 1 process circuit 200 will be described in the later section regarding the PLL 1 process circuit 200. The memory processing section 230, the serial communication processing section 240 and the internal processing section 250 each include a specific alarm detection section, which will be collectively referred to as an alarm detection section 210. The alarm detection section is corresponding to the error detection part.

The peripheral circuit reset circuit 400 has a function to, upon input of the input reset signal 20, keep the process of the PLL 1 process circuit 200 in a reset state until the lock signal of the PLL block 100 enters a locked state.

The clock device of the present embodiment facilitates the replacement of the PLLs regardless of the characteristics of the PLLs with a structure in which the PLL reset generator 120, the PLL state protection circuit 130, the clock interruption detection circuit 300 and the processing state protection circuit 220 are, referred to one of a peripheral circuit, arranged around the PLL circuit 110. These functional sections (the peripheral circuit) arranged around the PLL circuit 110 are configured in consideration of the possibility of device-dependency, the resetting sequence and the protection circuit.

The clock device of the present embodiment resets the PLLs on the basis of the state of the process which operates on the basis of the clocks output from the PLL block 100. It is therefore possible to avoid unnecessary resetting when the process is operating normally. This is because detection of the abnormalities in the PLLs with excessively high precision may reset the PLLs even if the process is operating normally. Since the clock device of the present embodiment resets the PLLs only after an abnormality is detected in the process, unnecessary reset operations can be avoided.

Hereinafter, details of each of the functional sections will be described. PLL Block 100

Figure 2:
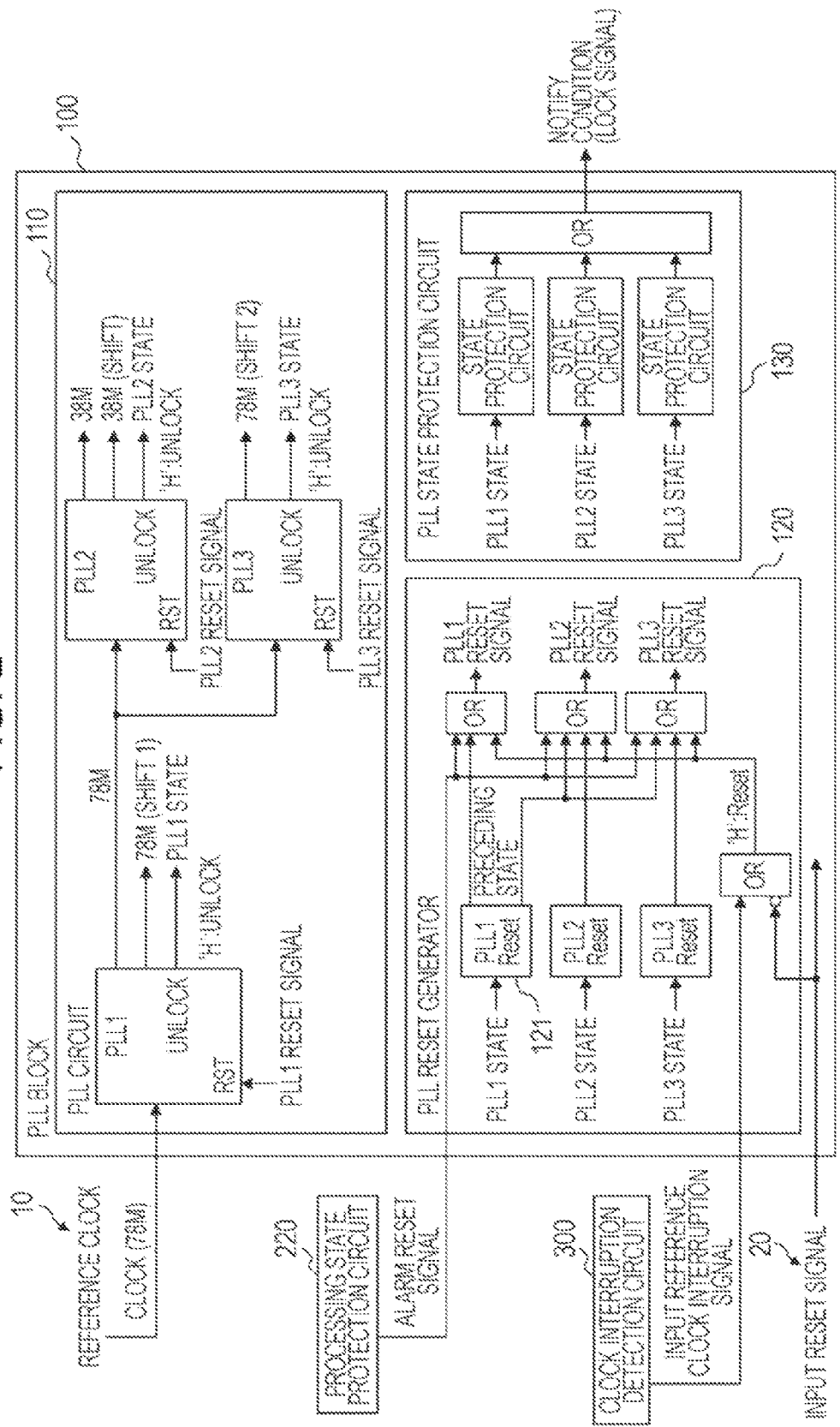
FIG. 2 illustrates an exemplary functional structure of a PLL block.

FIG. 2 is a block diagram of an exemplary functional structure of the PLL block 100.

A 78M clock is input to the PLL circuit 110 as the reference clock 10. The PLL circuit 110 outputs clock signals of four clocks, i.e., 78M (shift 1), 78M (shift 2), 38M and 38M (shift). Here, "shift" represents "phase shift."

Since the PLL does not generate four clocks, the PLL circuit 110 generates four clocks using three PLLs. In particular, the PLLs are connected in series with, for example, the PLL 1 as a preceding PLL and the PLL 2 and the PLL 3 as subsequent PLLs. The signal of the 78M clock output from the PLL 1 is used as the reference signals for the PLL 2 and the PLL 3.

The PLL 1 to the PLL 3 each output signals of a PLL state 1 to a PLL state 3, respectively. Here, the PLL state is "low (L)" with the output of each PLL being in the locked state and is "High (H)" with the output of each PLL being in the unlocked state.

The reset operation of the PLL circuit 110 will be described below. The PLL block 100 is reset at the following times: upon starting of the clock device on the basis of an external instruction from the input reset signal 20; upon interruption of the reference clock notified from the clock interruption detection circuit 300; upon input of the alarm information having a reset instruction from the processing state protection circuit 220; and upon occurrence of an abnormality in the PLLs themselves. Hereinafter, the reset operations at the following three times will be described.

The first reset operation is performed upon the initial operation, i.e., upon starting of the clock device on the basis of an external instruction from the input reset signal 20. The reset operations performed upon interruption of the reference clock notified from the clock interruption detection circuit 300 and upon input of the alarm information having a reset instruction from the processing state protection circuit 220 are the same as the reset operation upon the initial operation. That is, all the PLLs are reset. The second reset operation is performed upon entering of the preceding PLL 1 into the unlocked state during the operation. The third reset operation is performed upon entering of the subsequent PLL 2 or PLL 3 into the unlocked state during the operation. The second and the third reset operations are performed upon occurrence of an abnormality in PLLs themselves.

Figure 3:
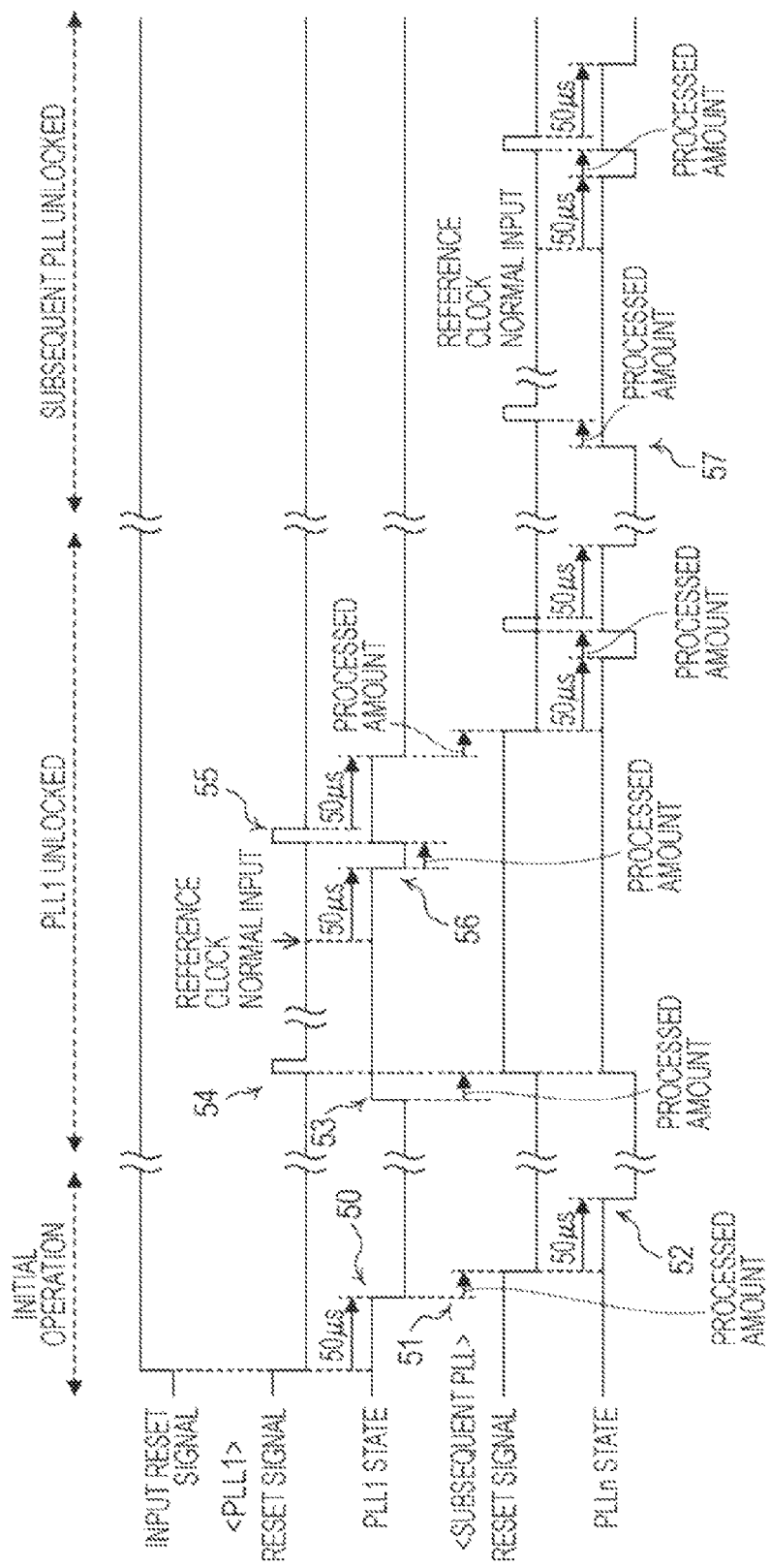
FIG. 3 illustrates a timing diagram of a reset operation.

FIG. 3 illustrates a timing diagram of the reset operation of the PLL block 100. The reset operation during the initial operation will be described first.

Let the PLL 1 to the PLL 3 enter the locked state in 50 microseconds after the reset operation is started. When the input reset signal 20 is released, i.e., the input reset signal 20 turns into "H," the PLL 1 reset signal turns into "L" and the reset is released. That is, the reset operation of the PLL 1 is started. The PLL 1 enters the locked state "L" in 50 microseconds (see signal 50).

Upon detection of the PLL 1 entering the locked state, the PLL 1 reset (circuit) of the PLL reset generator 120 performs predetermined processes (see process 51) and releases the reset of the subsequent PLL 2 and PLL 3. The reset operation of the PLL 2 and the PLL 3 is started. The PLL 2 and the PLL 3 enter the locked states "L" in 50 microseconds (see signal 52). Details of the predetermined processes of the PLL reset generator 120 will be described in the later section regarding the PLL reset generator 120.

Next, the reset operation upon entering of the PLL 1 into the unlocked state during the operation will be described.

When the PLL 1 enters the unlocked state "H" (see signal 53), the PLL 1 reset signal is generated in the PLL 1 reset (circuit) of the PLL reset generator 120 (see signal 54). The PLL 1 reset signal is generated for those PLLs which require the input of a reset signal upon entering into the unlocked state. Then, as the reference clocks is started to be input normally, the PLL 1 enters the locked state "L" in 50 microseconds.

For the reliable introduction into the locked state, the reset is generated again after the reference clock is input normally (see signal 55). In particular, the PLL 1 reset signal (see signal 55) is generated in the PLL 1 reset (circuit) upon entering of the PLL 1 into the locked state (see signal 56) and the introduction of the PLLs is started. The PLL 1 enters the locked state "L" in 50 microseconds. Upon detection of the PLL 1 entering the locked state, the PLL 1 reset (circuit) of the PLL reset generator 120 performs predetermined processes and the reset of the subsequent PLL 2 and PLL 3 is released. The reset operation of the PLL 2 and the PLL 3 is started to make them enter the locked states "L."

As described above, the PLLs of various characteristics can be reliably reset by the two-stage reset operation: the reset operation upon occurrence of an abnormality in the state of the PLLs; and the reset operation upon restoration of the states of the PLLs after the input of the reference clock 10 is started. Such a two-stage reset operation can be applied to those PLLs which, for example, require to be reset upon entering the unlocked state and which require to be reset after the normal input of the reference clock is started. The two-stage reset operation is performed by the PLL reset of the PLL reset generator 120 which will be described later.

Next, the reset operation upon entering of the subsequent PLL 2 or PLL 3 into the unlocked state during the operation will be described. This reset operation is the same as that performed upon entering of the PLL 1 into the unlocked state. In particular, when the PLL 2 or PLL 3 enters the unlocked state "H" (see signal 57), the PLL 1 reset signal is generated in the PLL 2 reset (circuit) or the PLL 3 reset (circuit) of the PLL reset generator 120. When the reference clock is started to be input normally, the PLL 2 or PLL 3 enters the locked state "L" in the 50 microseconds. Then, the reset is generated again.

PLL Reset Generator 120

The PLL reset generator 120 monitors changes in the states of the PLL 1 to the PLL 3, i.e., a change from the unlocked state to the locked state or a change from the locked state to the unlocked state, and generates the reset signal for each PLL. As described above with reference to the reset operation, the subsequent PLL 2 or PLL 3 is reset upon entering of the preceding PLL 1 into the unlocked state. In the present embodiment, the PLL 1 reset (circuit) to the PLL 3 reset (circuit) have the same circuit configuration and therefore will be collectively referred to as the "PLL reset (circuit)". However, there are outputs valid only in the PLL 1 reset (circuit). The PLL reset generator is corresponding to the reset part.

Figure 4:
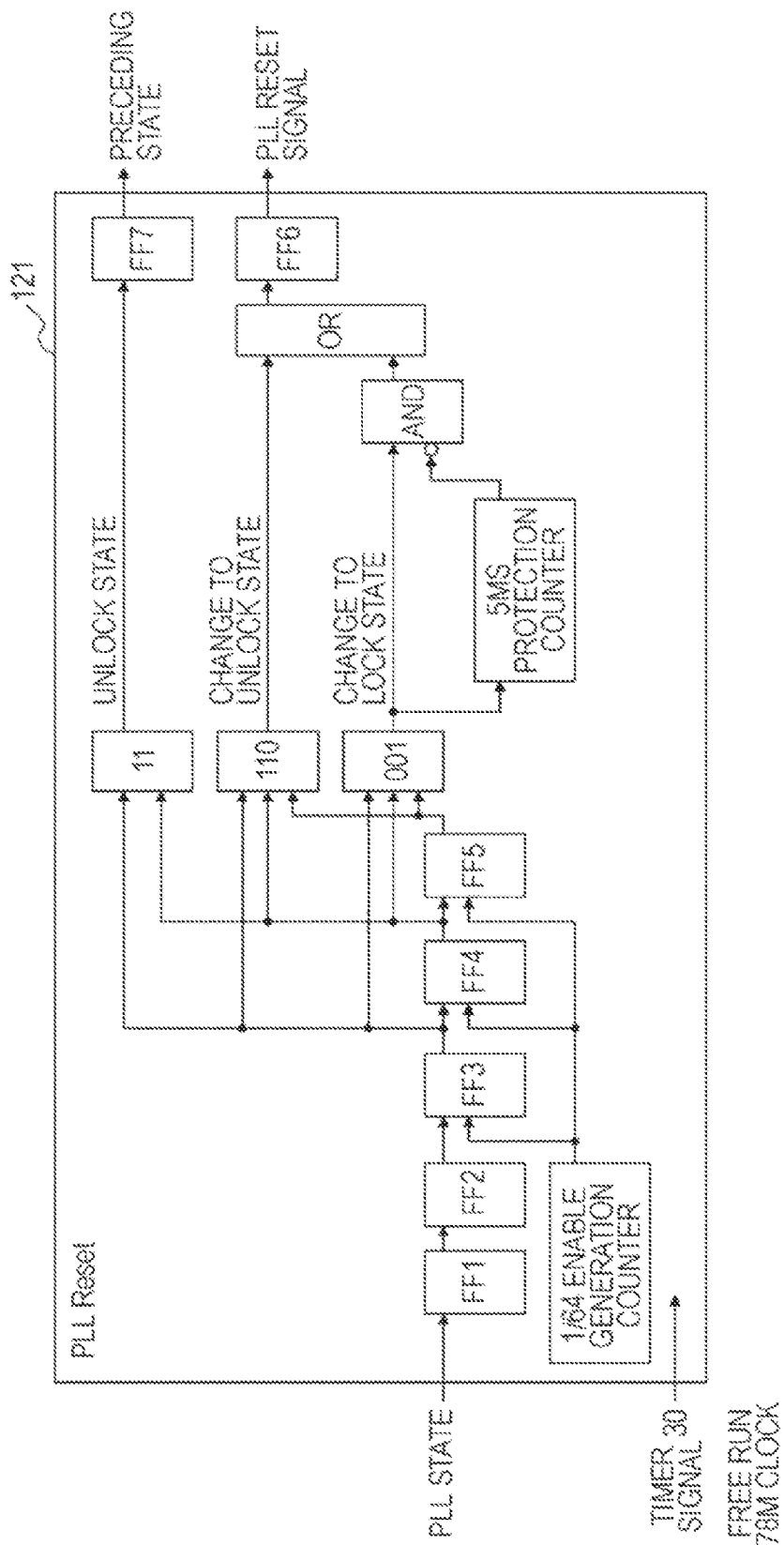
FIG. 4 illustrates an exemplary configuration of a PLL reset circuit.
Figure 5:
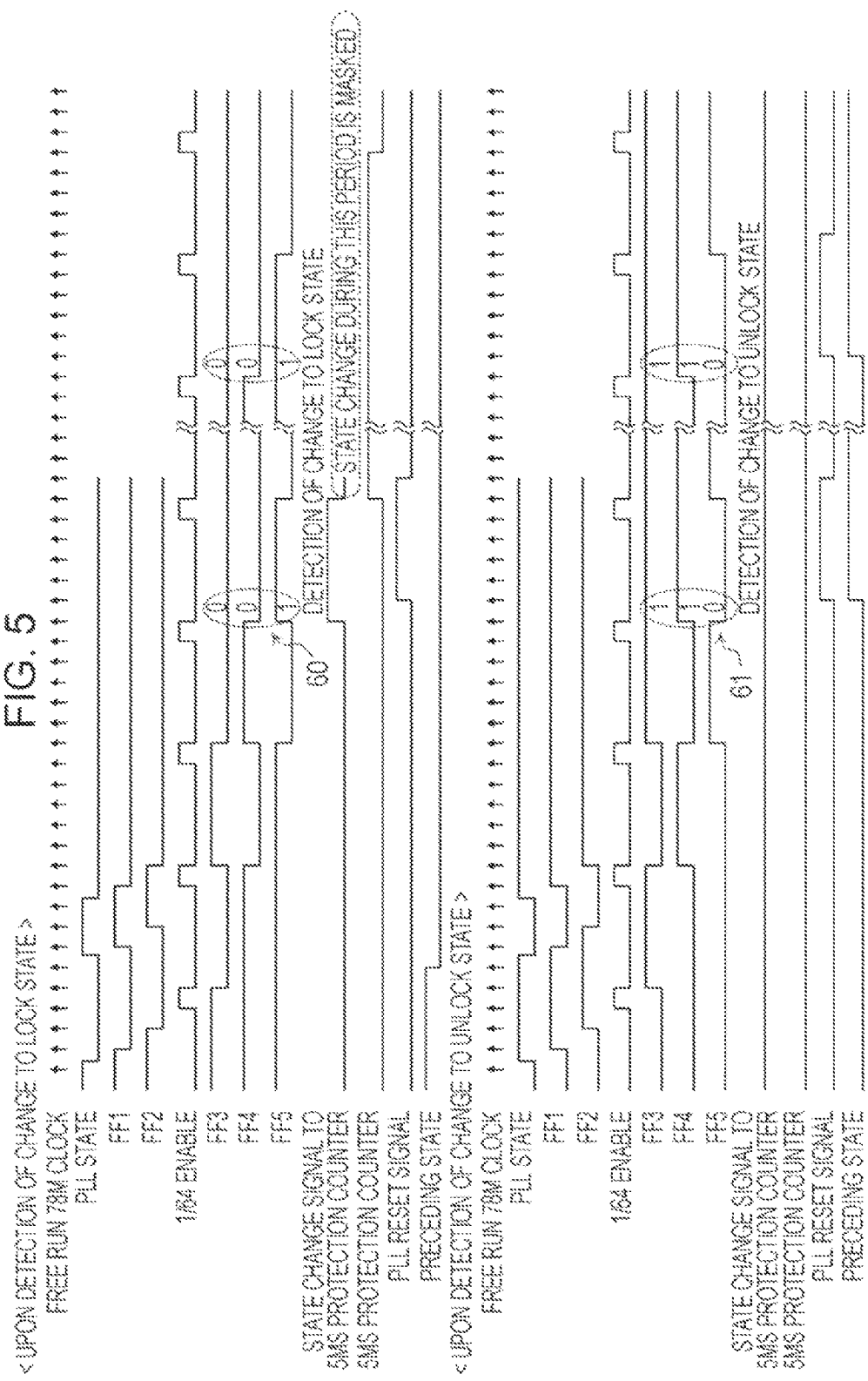
FIG. 5 illustrates timing diagrams of the PLL reset circuit.

FIG. 4 illustrates a circuit configuration of the PLL reset circuit. FIG. 5 illustrates timing diagrams of the PLL reset circuit. The PLL reset circuit will be described with reference to the timing diagram.

The signals (PLL STATE) indicating the states of the corresponding PLLs are input to the PLL reset circuit. The PLL reset circuit makes the states of the PLLs be synchronized with a free-run (free running oscillation) 78M clock which is an operation clock in FF 1 and FF 2. The signal of the free-run 78M clock is a timer signal 30 illustrated in FIG. 1.

A $\frac{1}{64}$ enable generation counter having about 823-ns cycle time is employed as an enable counter in the present embodiment. Any enable counters which generate the PLL reset operation signal that satisfies a limit on a reset width of the PLL can be employed depending on the devices used.

First, reference is made to the timing diagrams of FIG. 5 upon detection of the change to the locked state. The $\frac{1}{64}$ enable generation counter generates signals which have 823-ns cycle time for each one pulse width of the free-run 78M clock. The $\frac{1}{64}$ enable generation counter makes the signal of the PLL state shift in three stages in FF 3 to FF 5 using the enable signal and generates a change pulse from the unlocked state to the locked state. When the FF 3, the FF 4 and the FF 5 are "0," "0" and "1," respectively, it is determined that the PLL state has been changed from the unlocked state to the locked state (see signal 60). The change pulse is output as a PLL reset signal. Since the PLLs enter the unlocked state again with the reset operation, a mask processing is performed using a 5-ms protection counter for masking the reset pulse in order not to reset the PLL again in 5 ms after the reset from the unlocked state to the locked state with the change pulse. For example, the change to the locked state represented by the signal 56 in FIG. 3 is detected, the PLL reset operation signal corresponding to the signal 55 is output and then the PLLs enter again the locked state. Here, the mask is applied such that the entering of the PLLs again into the locked state might not be detected.

Next, reference will be made to the timing diagram of FIG. 5 upon detection of the change to the unlocked state. In the same manner as in the detection of the change to the locked state, the $\frac{1}{64}$ enable generation counter makes the signal of the PLL state shift in three stages in FF 3 to FF 5 using the enable signal and generates a change pulse from the locked state to the unlocked state. When the FF 3, the FF 4 and the FF 5 are "1," "1" and "0," respectively, it is determined that the PLL state has been changed from the locked state to the unlocked state (see signal 61). The change pulse is output as a PLL reset signal. The output of the preceding state is output as "H" when the FF 3 and the FF 4 are both in the unlocked state "H." The output of the preceding state is valid only in the PLL 1 reset circuit 121.

PLL State Protection Circuit 130

Figure 6:
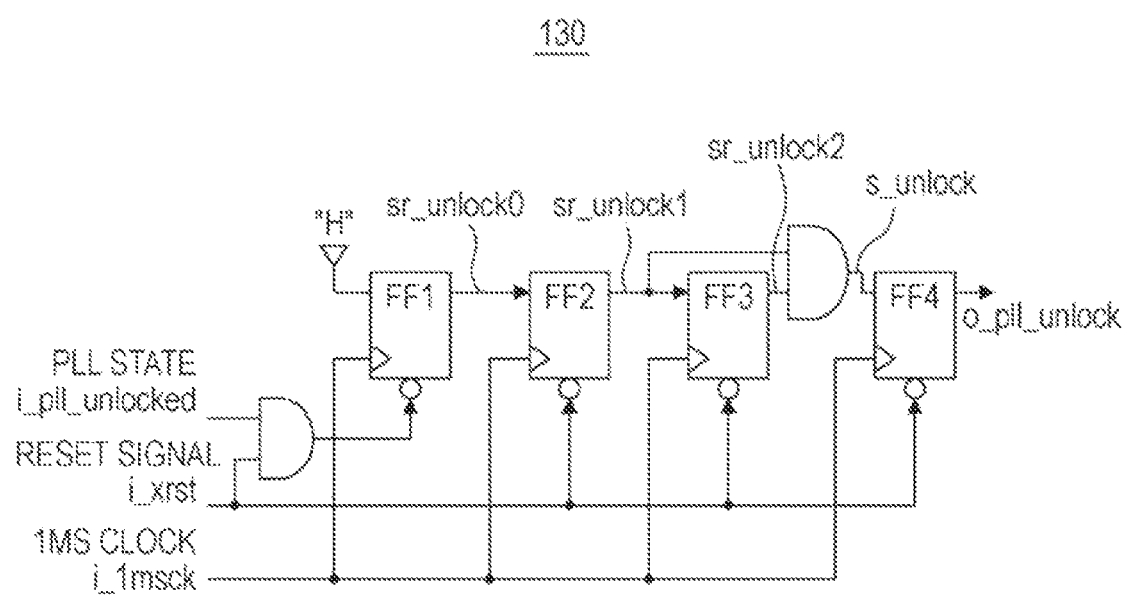
FIG. 6 illustrates an exemplary configuration of a PLL state protection circuit.

FIG. 6 illustrates a circuit configuration of the PLL state protection circuit 130. The number of the PLL state protection circuits 130 is equivalent to that of the PLLs which constitute the PLL circuit 110. The PLL state protection circuit 130 prevents glitches of the lock signals due to frequent state changes from the abnormal operation to the normal operation and from the normal operation to the abnormal operation. In particular, the PLL state protection circuit 130 of each PLL does not output the state signal notifying the entering of the corresponding PLL into the unlocked state unless the PLL continues being in the unlocked state for a predetermined period of time. Thus, the lock signal obtained through the logical AND operation of the state signals of the PLLs is stable.

Figure 7:
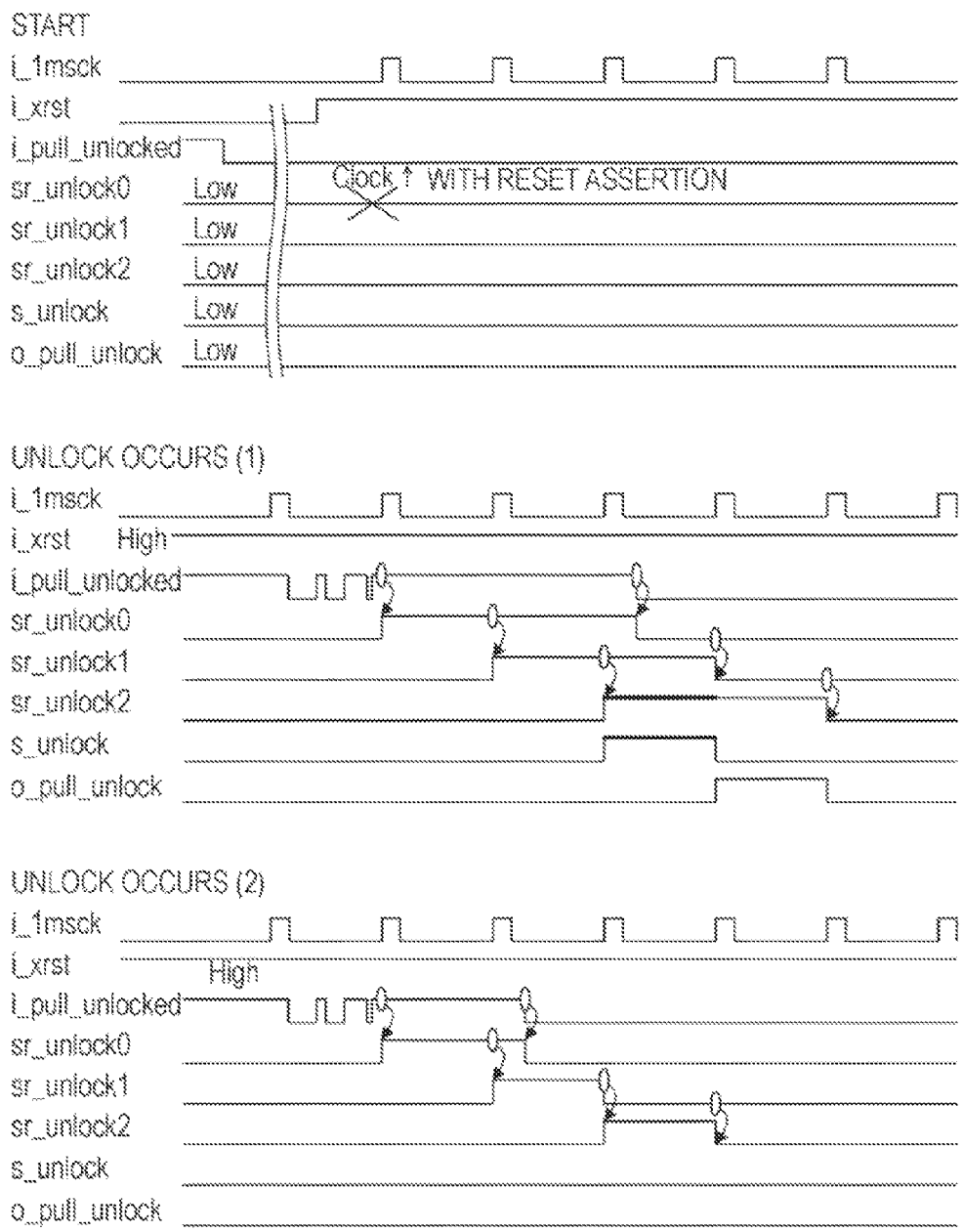
FIG. 7 illustrates timing diagrams of the PLL state protection circuit.

FIG. 7 illustrates timing diagrams of the PLL state protection circuit 130. The signal indicating the PLL state of the corresponding PLL is input to the PLL state protection circuit 130. The PLL state protection circuit 130 monitors the state during 1 ms which is the intervals between rising edges of the 1-ms timer signal. The PLL state protection circuit 130 determines that the PLL is in the unlocked state only when the unlocked state continues for 1 ms and the unlocked state continues twice, i.e., when the unlocked state continues for 2 ms. When the PLL is in the unlocked state for 1 ms, the FF 1 is not reset and remains as "H."

Clock Interruption Detection Circuit 300

The clock interruption detection circuit 300 detects the state of the clock interruption of the reference clock 10.

Figure 8:
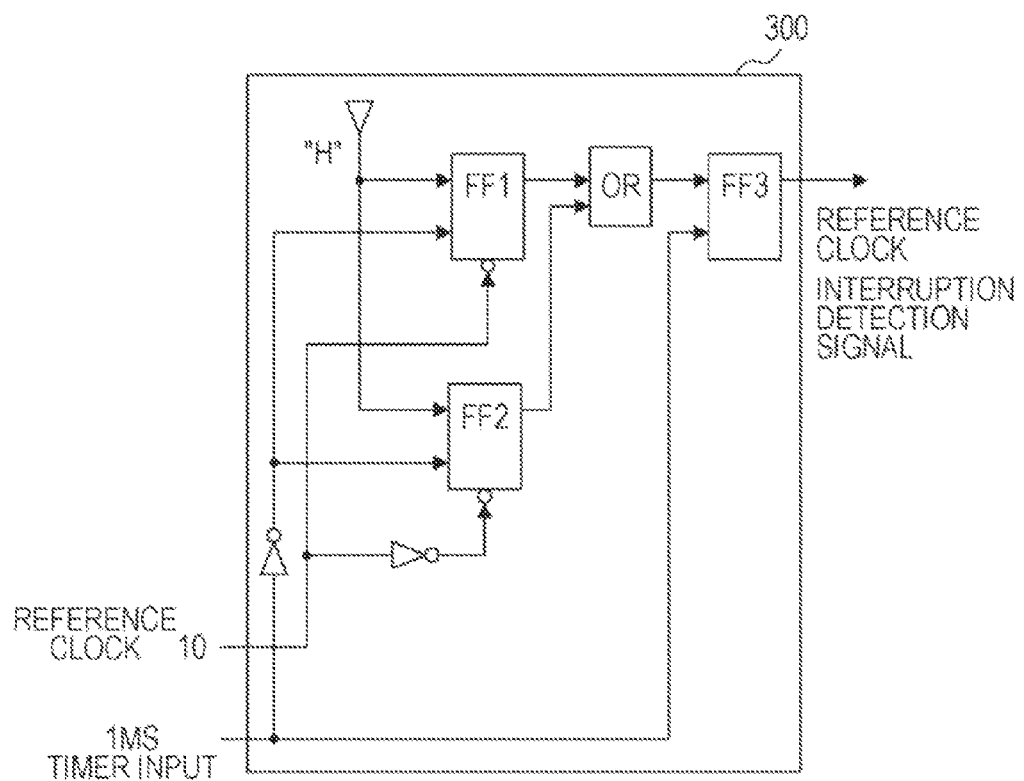
FIG. 8 illustrates an exemplary configuration of a clock interruption detection circuit.

FIG. 8 is a circuit configuration of the clock interruption detection circuit 300. FIG. 9 illustrates timing diagrams of the clock interruption detection circuit 300.

The reference clock 10 as an interruption detection target and the 1-ms timer signal are input to the clock interruption detection circuit 300. The FF 1 and the FF 2 are set to "H" at falling edges of the 1-ms timer signal. Next, if the clock of the reference clock 10 changes from "L" to "H" or from "H" to "L" even only once before the falling edge of the 1-ms timer signal is input (see signal 70), the FF 1 and the FF 2 turn into "L." The OR logic information of the FF 1 and the FF 2 is taken into the FF 3 at the rising edges of the 1-ms timer signal and used as interruption detection information. The interruption detection information is then output as "state with no interruption detected" in the state "L" and as the "state with interruption detected" in the state "H."

Peripheral Circuit Reset Circuit 400

Upon input of the input reset signal 20, the peripheral circuit reset circuit 400 keeps the PLL 1 process circuit 200 and the CPU INF 500 in the reset state until the clock output from the PLL block 100 is stabilized, i.e., until the lock signal output from the PLL block 100 enters the locked state. With this, the PLL 1 process circuit 200 and the CPU INF 500 operate on the basis of the stable clocks. For example, the peripheral circuit reset circuit 400 operates upon starting of the device.

Figure 10:
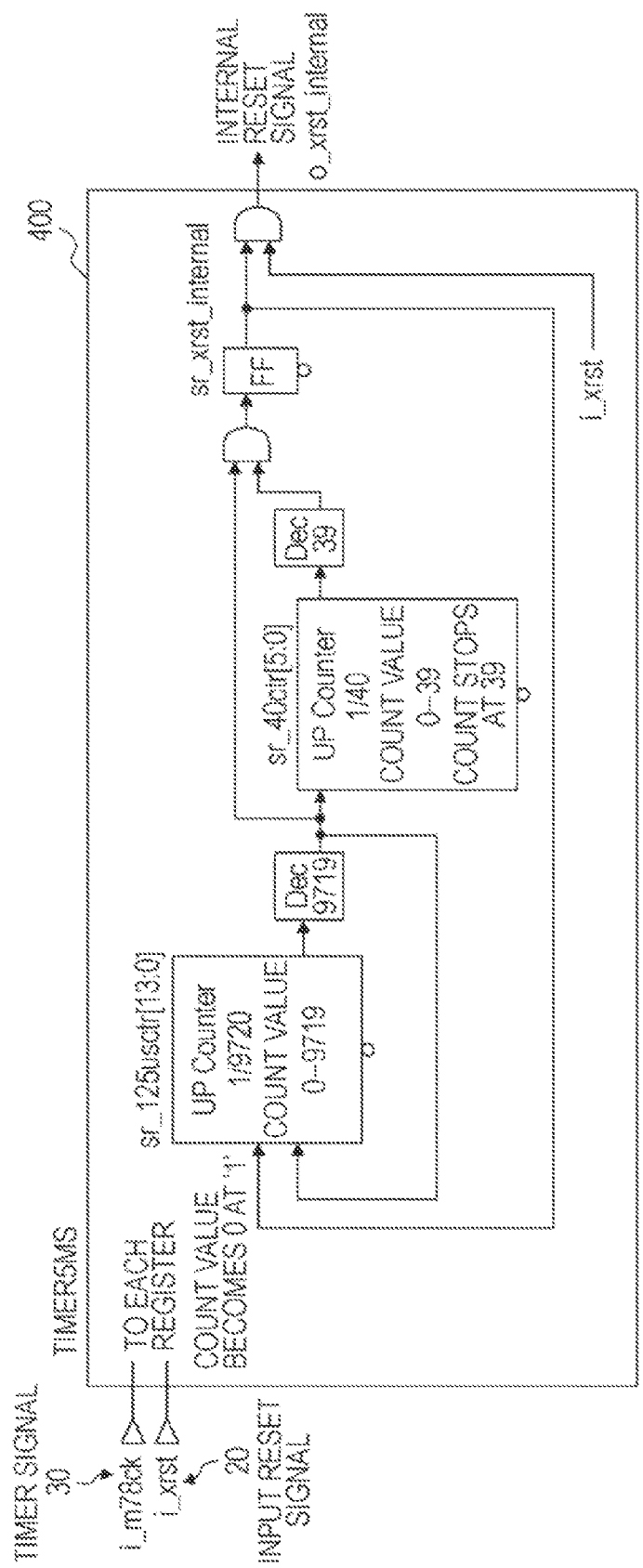
FIG. 10 illustrates an exemplary configuration of a peripheral circuit reset circuit.

FIG. 10 illustrates a circuit configuration of the peripheral circuit reset circuit 400. In particular, the peripheral circuit reset circuit 400 extends the reset signal until the clock is stabilized. The peripheral circuit reset circuit 400 extends the input reset signal 20 by 5 ms with the input clock signal which is not the clock generated by the PLL, i.e., the timer signal 30 of the free-run 78M clock. The peripheral circuit reset circuit 400 includes two up-counters which easily satisfy the internal timing requirements.

Figure 11:
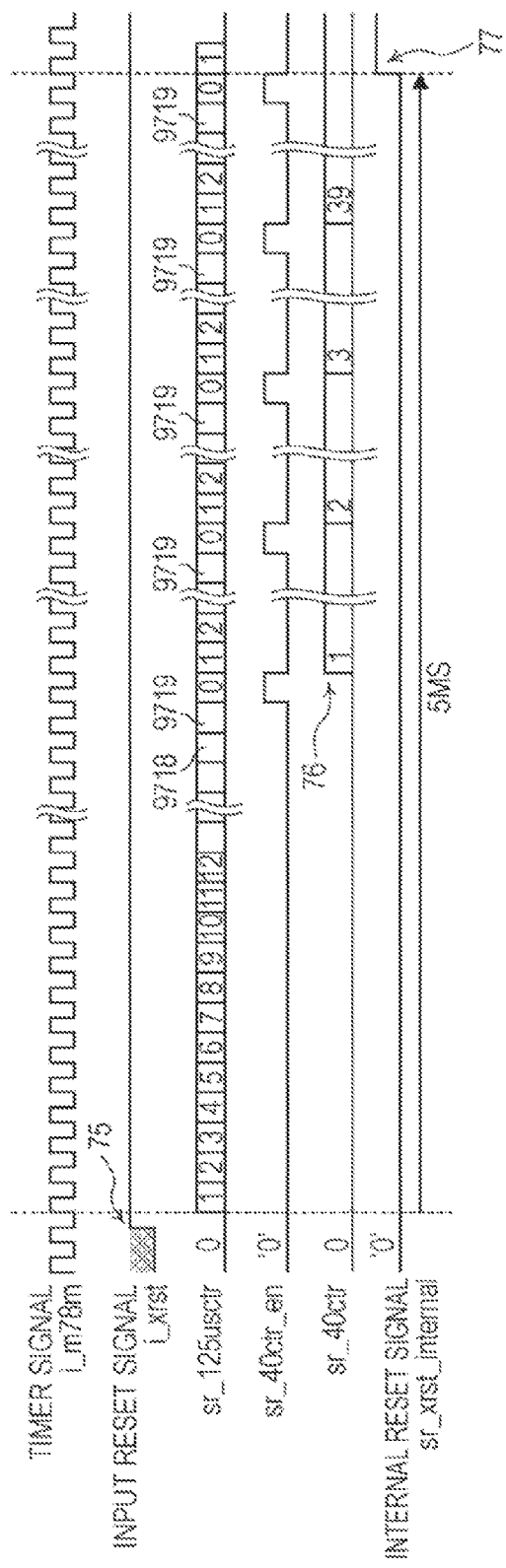
FIG. 11 illustrates a timing diagram of the peripheral circuit reset circuit.

FIG. 11 illustrates a timing diagram of the peripheral circuit reset circuit 400. Upon release of the input reset signal 20 (i_xrst) input from the outside (see signal 75), the up-counters for reset extension (sr_125 usctr and sr_40 ctr) start counting up. Whenever the up-counter (sr_125 usctr) counts from "0" to "9719," the up-counter (sr_40 ctr) is counted up (see signal 76). When the up-counter (sr_40 ctr) is counted up to "39" and returns to "0," the internal reset signal is output (see signal 77).

PLL 1 Process Circuit 200

The memory processing section 230, the serial communication processing section 240 and the internal processing section 250 included in the PLL 1 process circuit 200 will be described. The memory processing section 230, the serial communication processing section 240 and the internal processing section 250 each include a specific alarm detection section, so that the alarm detection section 210 will be described therein.

Memory Processing Section 230

The memory processing section 230 checks quality of the memory, such as the quad data rate—static random access memory (QDR-SRAM) and the memory included in the ASIC/FPGA.

Figure 12:
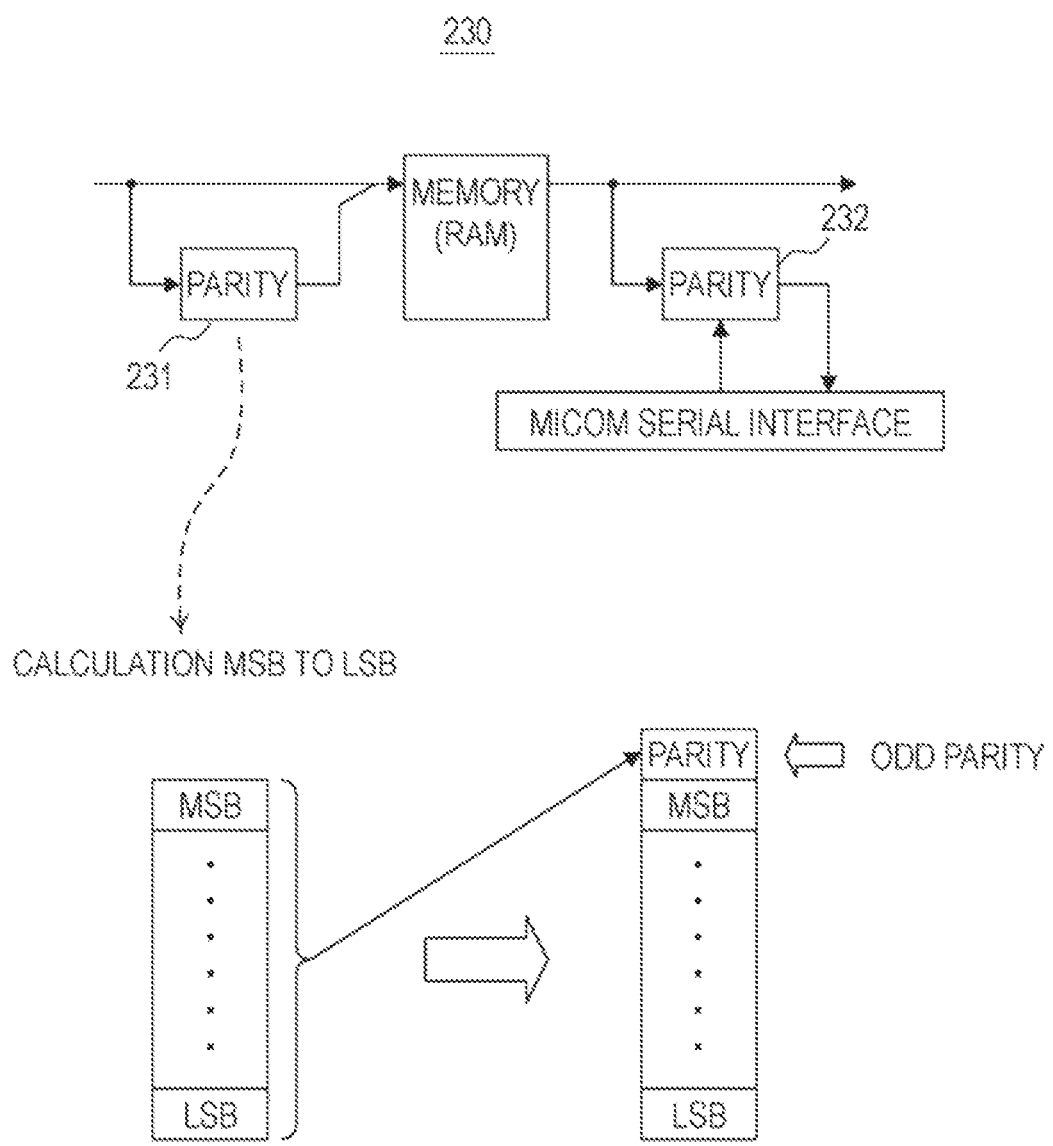
FIG. 12 illustrates an exemplary configuration of a memory processing section.

FIG. 12 illustrates a configuration of the memory processing section 230. The memory processing section 230 includes a block 231 which adds a parity bit to the data before the data is written in the memory, and a block 232 which checks the parity of the read data. The parity is, for example, odd parity. An 1-bit parity bit is added to the data of predetermined length, e.g., 8 bits, and the parity bit is set such that the number of "1s" included in the data with the parity bit might be an odd number. The block 232 which checks the parity corresponds to the alarm detection section 210 in the memory processing section 230.

Serial Communication Processing Section 240

Figure 13:
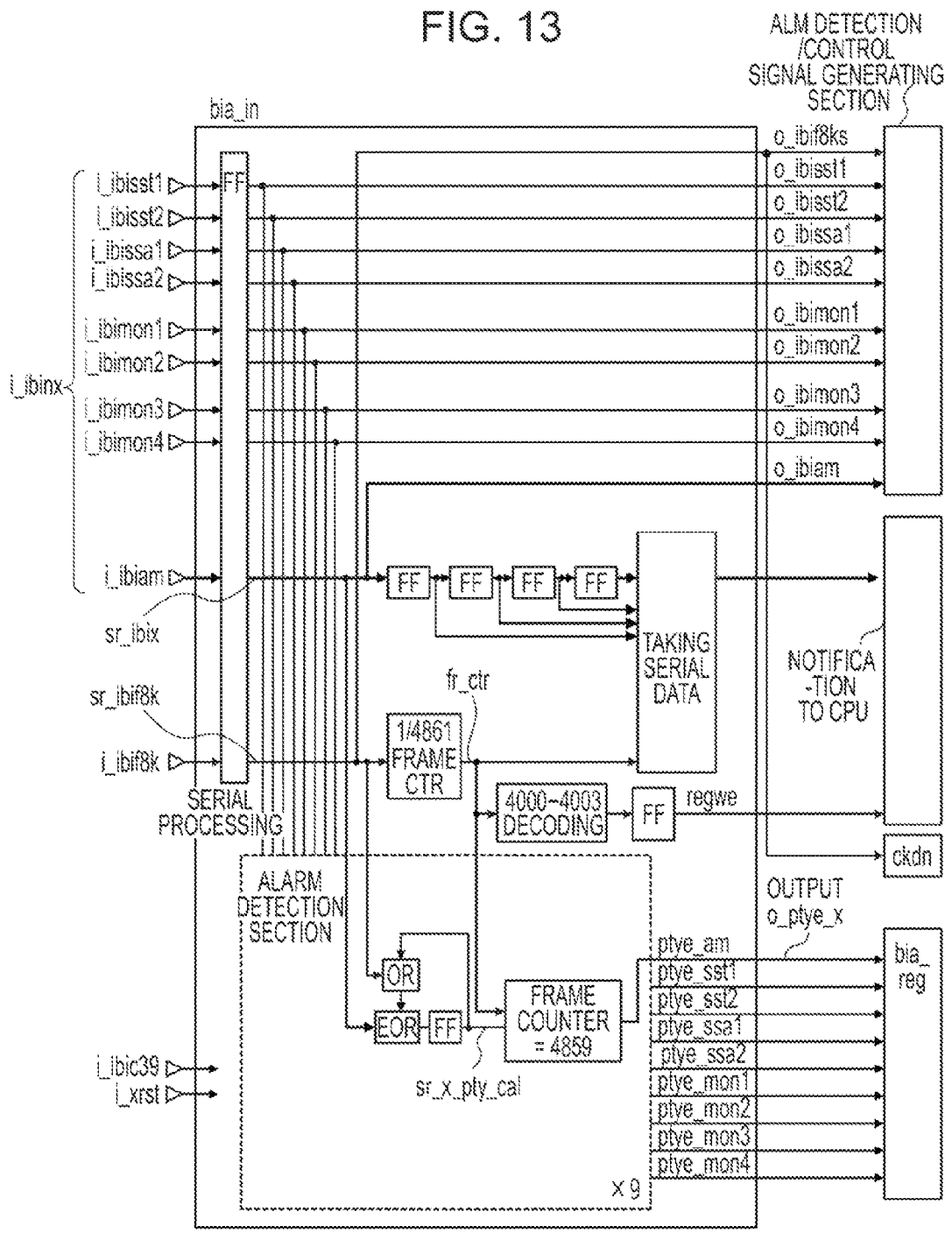
FIG. 13 illustrates an exemplary configuration of a serial communication processing section.

FIG. 13 illustrates a configuration of the serial communication processing section 240. The serial communication processing section 240 includes its own alarm detection section. The serial communication processing section 240 takes in nine rows of serial data (i_ibinx) which are input, and checks the parity of each row in the alarm detection section. Accordingly, nine alarm detection sections are provided. The alarm detection section of FIG. 13 illustrates a process of "i_ibiam" which is one of the rows of serial data. A reference clock (i_ibic39) for taking the serial signal in, and a frame pulse (i_ibif8k) which represents a first bit of the frame are input to the serial communication processing section 240. The serial communication processing section 240 generates a frame counter on the basis of the input timing of the frame and takes the serial data in.

The result of the parity check and the clock interruption of the output data are also notified to the serial data output from the ASIC/FPGA. Thus, error monitoring is performed through determination of the result of the monitored quality of the output clock.

The alarm detection section checks the parity of each frame on the basis of the input timing of the frame. In particular, the alarm detection section detects errors by calculating the (odd) parity in the frame of the serial data to the final bit being the parity bit. The alarm information is obtained through the logical OR operation of the error information notified with the serial data and the error information (output o_ptyp_x) detected in the alarm detection section.

Figure 14:
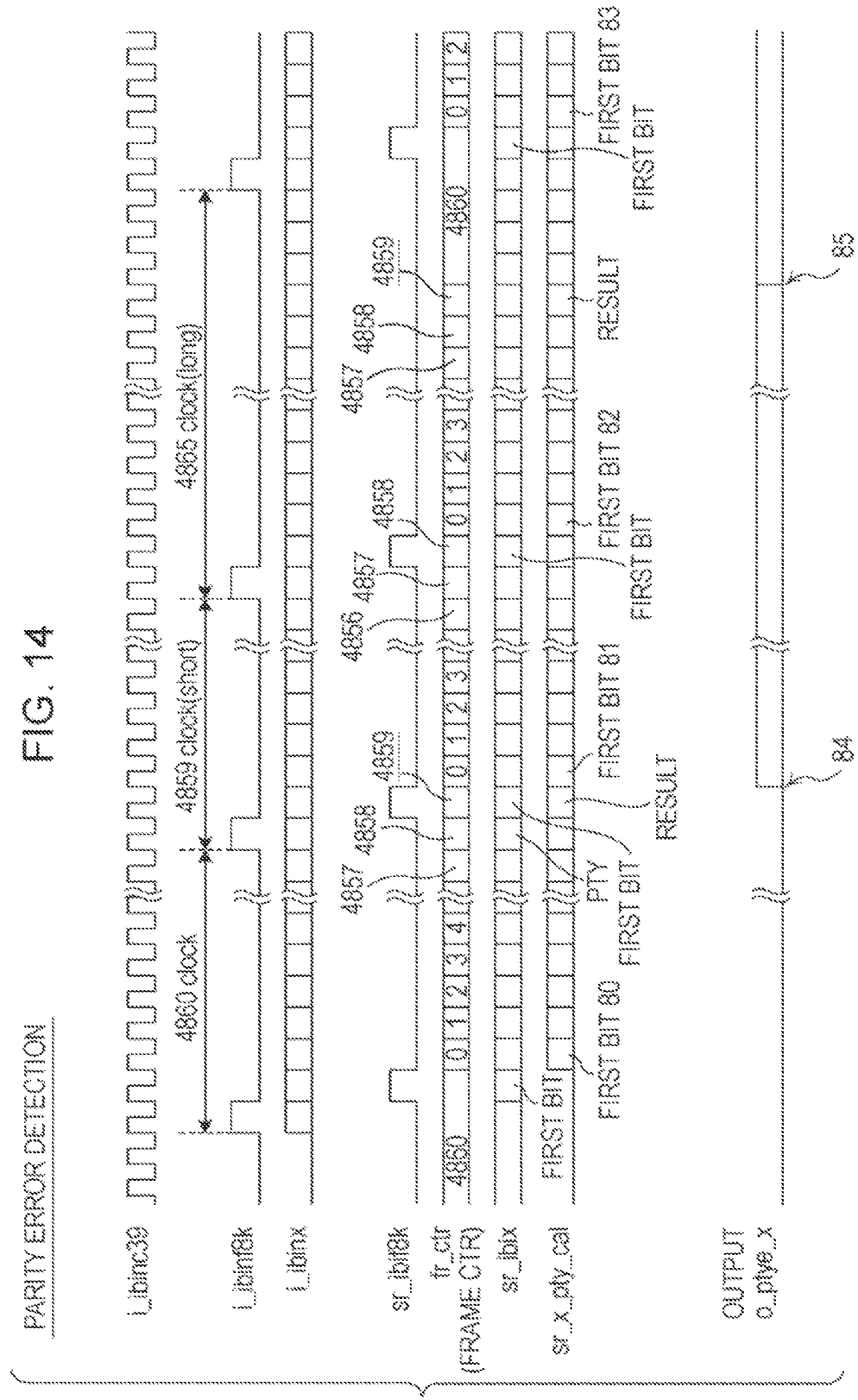
FIG. 14 illustrates a timing diagram of the serial communication processing section.

FIG. 14 illustrates a timing diagram of the serial communication processing section 240.

A frame counter (outputting fr_ctr) starts counting up on the basis of the frame timing (sr_ibif8k) which is input, and the serial data (sr_ibix) is taken in for each frame. Upon input of the frame timing (sr_ibif8k), the frame counter is set to "0." The serial communication processing section 240 checks the parity from the first bit to the last bit of the one frame of the serial data (sr_ibix). The error information of each frame (every 125 us) is then latched and notified. For example, the parity check is started from the first bit 80. When the frame timing (sr_ibif8K) is "H," the calculation for the parity check of the next frame is started from the first bit 81 (sr_x_pty_cal). As in the first bit 81, the calculation for the parity check of the subsequent frames is started from the first bits 82 and 83. When the frame counter (outputting fr_ctr) counts up to "4859," the sr_x_pty_cal is latched (see output 84). Since the frame beginning from the first bit 82 is a short frame and the frame counter (outputting fr_ctr) does not count up to "4859," the sr_x_pty_cal is not latched. Since the subsequent frame is a long frame, the sr_x_pty_cal is latched when the frame counter (outputting fr_ctr) counts up to "4859" (see output 85).

Internal Processing Section 250

The internal processing section 250 implements a function to store received data based on a received clock in the internal memory and then read the data from the internal memory in synchronization with the clocks input from the PLLs. The received clock is recovered from the received data and thus has a fluctuating frequency. Accordingly, the internal memory mounted on the internal processing section 250 has a function to absorb the fluctuation of the input data and to reset the control information, such as an internal pointer, upon detection of an internal memory error. It is necessary to perform a clock change in a write pointer for the control of the writing and reading sides of the internal memory. Thus, a gray code with smaller bit changes is used for the circuit which performs the clock change of a plurality of bit counters.

Figure 15:
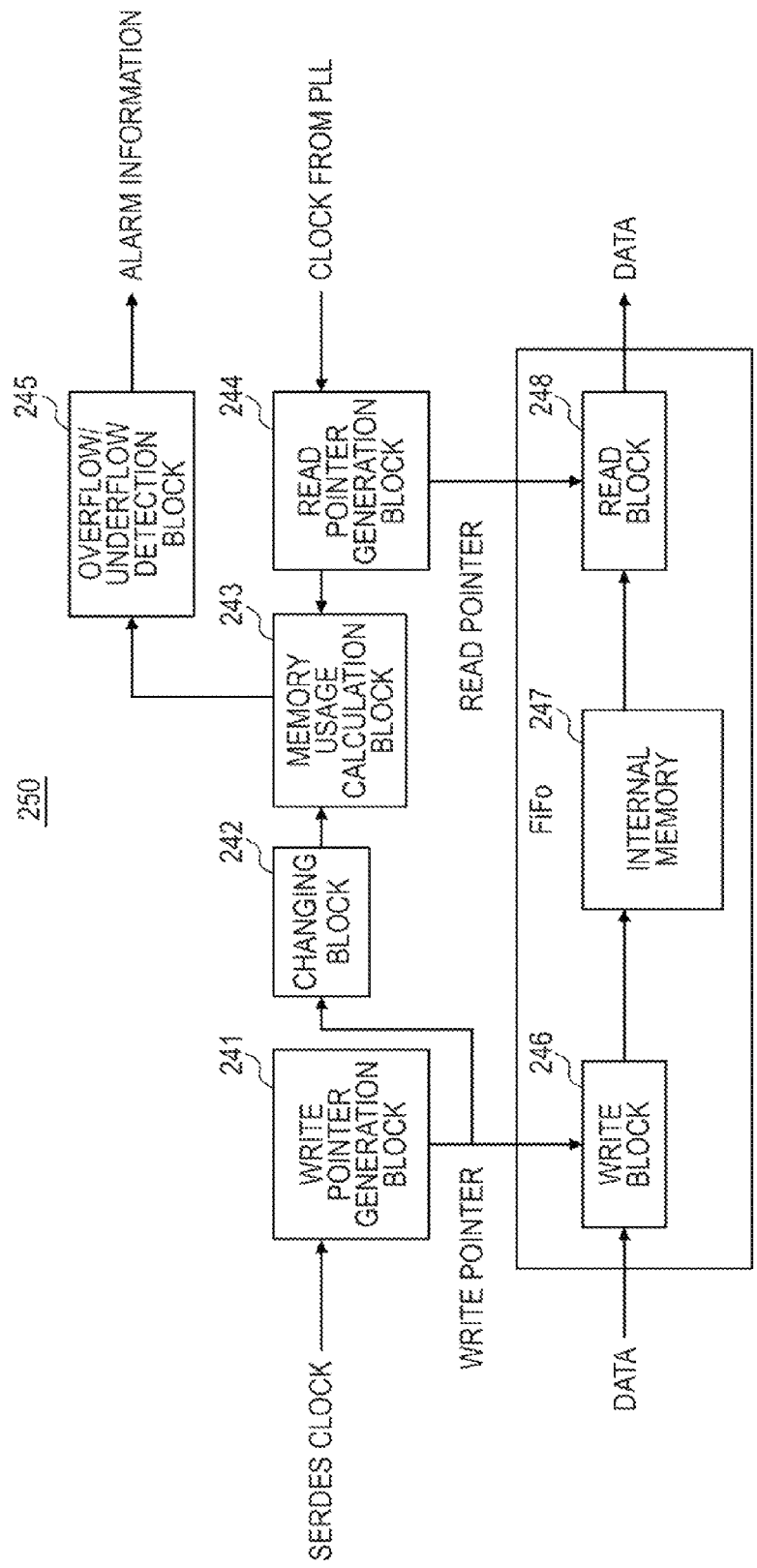
FIG. 15 illustrates an exemplary configuration of an internal processing section.

FIG. 15 illustrates a circuit configuration of the internal processing section 250. FIG. 16 illustrates timing diagrams of the internal processing section 250. Here, the capacity of the internal memory 247 in words is 16.

After the reset is released, the internal processing section 250 increments the pointers from a state in which the write pointer generated by the write pointer generation block 241 is "0" and the read pointer generated in the read pointer generation block 244 is "8." The write pointer generation block 241 operates on the basis of the received clock that is a SerDes clock of a function of Serializer/Deserializer. The read pointer generation block 244 operates on the basis of the clock input from the PLL block 100.

When the clock is stable, data is written in and read from the internal memory 247 with the memory usage being "8" (see the timing diagram of <control start> in FIG. 16). Data is written by a write block 246 and is read by a read block 248. Since the write pointer and the read pointer writes and reads data with the 8-word intervals, the clock change of the write pointer is performed and the memory usage is calculated with the clock at the reading side. The memory usage is calculated by a memory usage calculation block 243, which outputs the calculated memory usage to an overflow/underflow detection block 245.

The value of the write pointer used for the calculation of the memory usage is the value after the clock change to the reading side in a change block 242. The value is calculated with estimated delay of the clock change during the calculation.

An overflow is detected when the memory usage in words calculated by the memory usage calculation block 243 is 14 or 15 (see the timing diagram of <upon detection OVF> in FIG. 16). An underflow is detected when memory usage is 1 word (see the timing diagram of <upon detection UDF> in FIG. 16). The overflow/underflow detection block 245 detects the overflow and the underflow, and outputs the alarm information. When the memory usage in words is 0, both the overflow and the underflow will be detected. When either the overflow or the underflow is detected, the interval of the write pointer and the read pointer is returned to 8 in words. In particular, the write pointer and the read pointer of the internal memory are initialized. Initialization herein is to change the read pointer compulsorily such that the difference between the write pointer and the read pointer might be 8 cycles. The detected overflow and the underflow in the internal memory 247 are notified to the alarm detection section 210. The write pointer generation block and the write block are corresponding to the receiving part, the read pointer generation block and the read block are corresponding to the transmitting part.

The timing diagram illustrated in FIG. 16 will be described below.

After the reset is released, counting up of the read pointer and the write pointer are started. At the initial state, the read pointer and the write pointer are displaced by 8 addresses from each other. If the clock frequencies at the writing and reading sides are in agreement, data is continuously read out with the memory usage being "8".

If, however, the clock frequency at the writing side is lower than that of the reading side, the memory usage is reduced and an underflow is detected when the memory usage becomes "1." The read pointer is then substituted by a value obtained by subtracting 4 from the value of the read pointer. Thus, the memory usage returns to "8." If the clock frequency at the writing side is higher than that of the reading side, the memory usage is increased and an overflow is detected when the memory usage becomes "14" or "15." The read pointer is then substituted by a value obtained by subtracting 4 from the value of the write pointer. Thus, the memory usage returns to "8." Only when the memory usage becomes "0," both the overflow and the underflow are detected and the memory usage returns to "8." Thresholds used for the detection of the overflow and the underflow herein are values with a sufficient margin such that no data error might occur due to the mismatch of the pointers in a preceding value.

CPU INF 500

Figure 17:
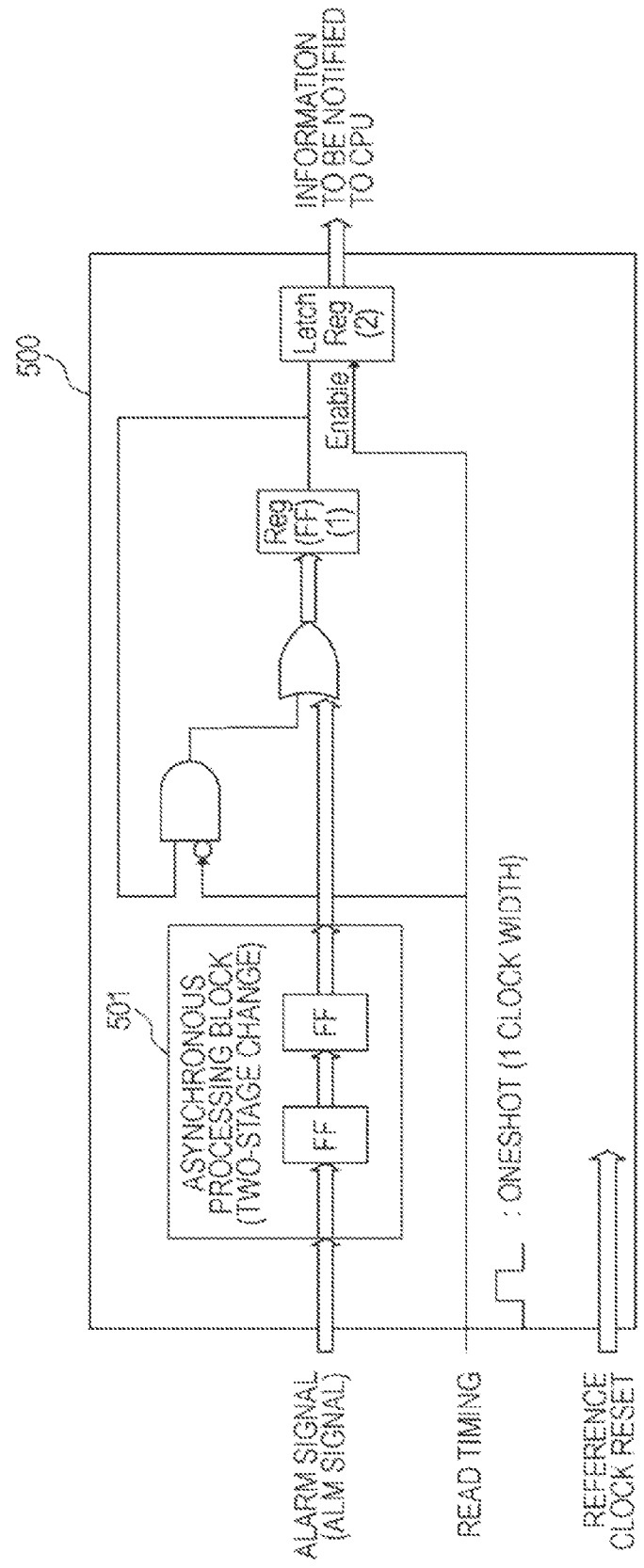
FIG. 17 illustrates an exemplary configuration of a CPU INF.
Figure 18:
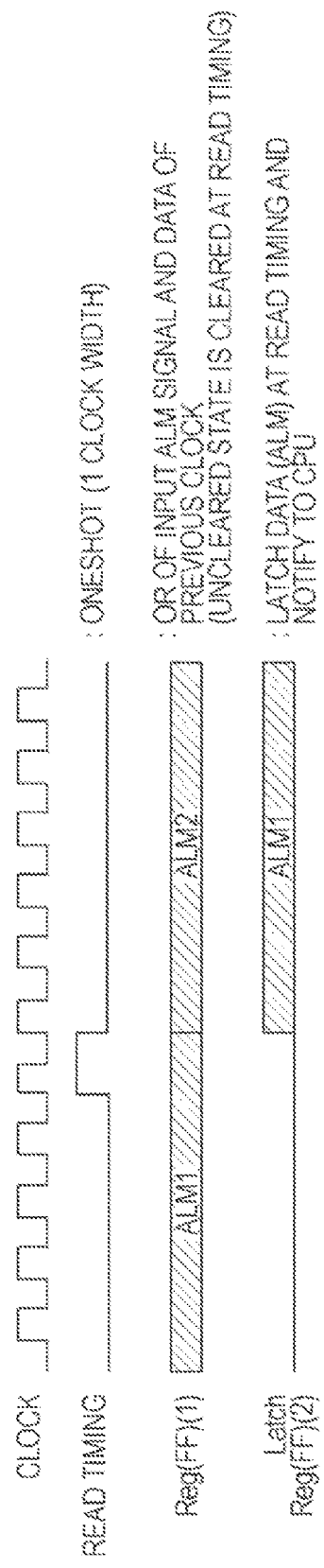
FIG. 18 illustrates a timing diagram of the CPU INF.

FIG. 17 illustrates a configuration of the CPU INF 500. FIG. 18 illustrates a timing diagram of the CPU INF 500, which is the timing diagram of the read-on-clear operation.

The CPU INF 500 is adapted to notify the CPU of the information with correspondence to the alarm to leave as a history. For example, the CPU INF 500 is adapted to store 8-bit data with each bit assigned to each alarm. In an asynchronous processing block 501, an alarm (ALM) signal input from the alarm detection section 210 is changed to the reference clock of the PLL reset generator 120. In a Reg (FF) (1), the alarm information generated in the reading cycle time from the CPU is latched. The reading cycle time is represented by the read timing. When the read timing becomes "H," the output of the Reg (FF) (1) is taken into a LatchReg (2), and is latched. Then, the Reg (FF) (1) is cleared. The latched data is defined as the information to be notified to the CPU, i.e., the history information. In addition to the ALM signal, the lock signal output from the PLL state protection circuit 130 is notified to the CPU.

Processing State Protection Circuit 220

The processing state protection circuit 220 is a block which protects the alarm signal detected in the processes, such as the PLL 1 process circuit 200. The alarm signal is detected in each of the memory processing section 230, the serial communication processing section 240 and the internal processing section 250.

Figure 19:
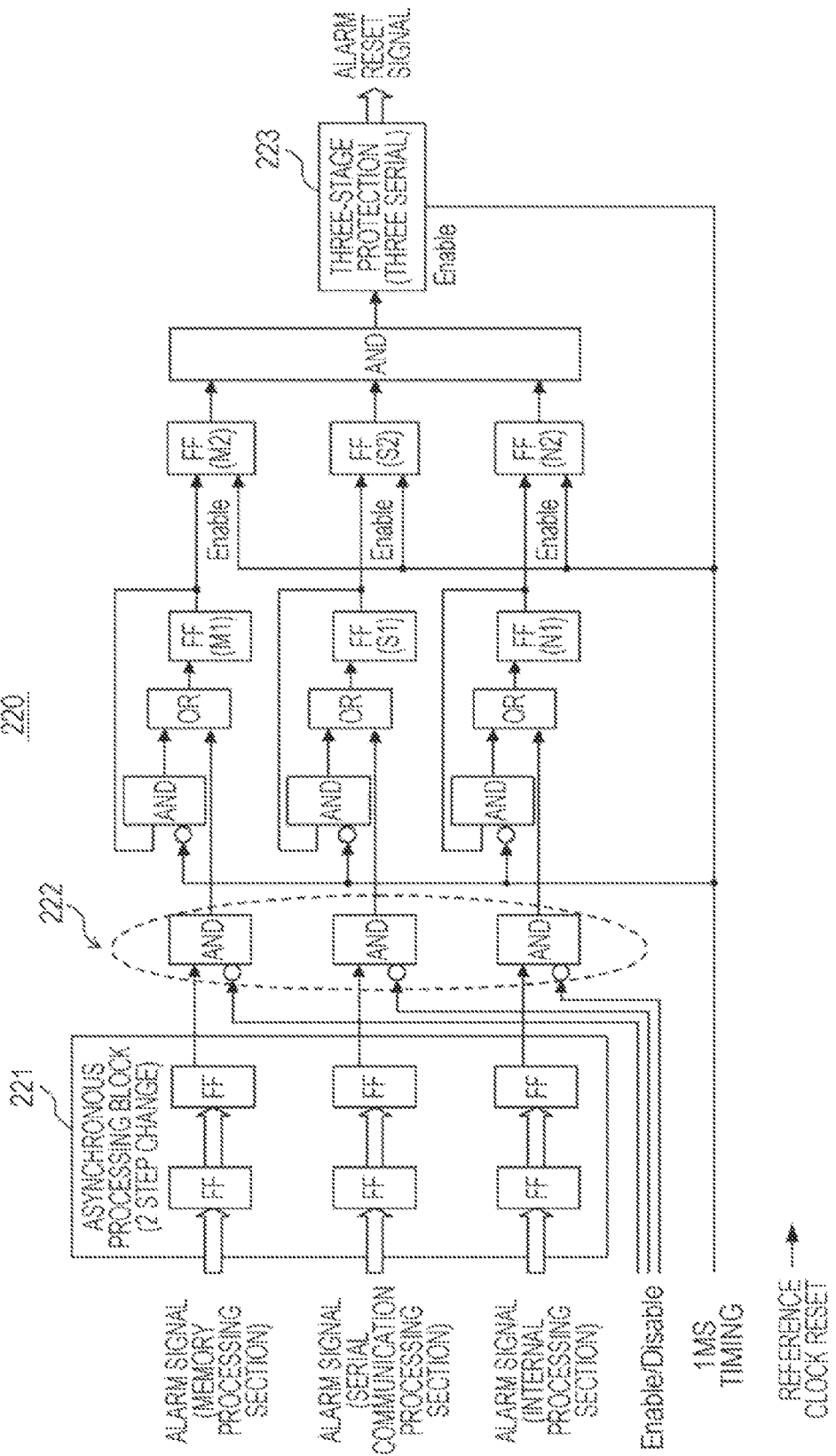
FIG. 19 illustrates an exemplary configuration of a processing state protection circuit.

FIG. 19 illustrates the exemplary configuration of the processing state protection circuit 220.

In an asynchronous processing block 221, the alarm signals detected in the memory processing section 230, the serial communication processing section 240 and the internal processing section 250 are changed to the reference clocks of the PLL reset generator 120. Then, necessity of the reset is determined independently. In particular, an enable/disable setting (see circuit 222) is made for the determination whether the input alarm signal is defined as a reset condition. After the determination, the alarm signals produced within the 1-ms cycle time are latched in the FFs (M1, S1, N1). The 1-ms cycle time is represented by the read timing. When the read timing becomes "H," the FFs (M1, S1, N1) are cleared and the alarm signals are taken into subsequent FFs (M2, S2, N2) and latched. The processing state protection circuit is corresponding to the determination part.

Information with all the latched alarm signals is monitored in three consecutive steps in a three-step protection block 223, and is output as an ALM reset signal. In particular, when the alarm signals are input three consecutive times, the ALM reset signal to reset all the PLLs instructing the PLL reset generator 120 is output. Although each of the PLL 1 process to PLL n process includes its own processing state protection circuit 220, the alarm reset signal output from any processing state protection circuit 220 in the present embodiment also instructs the PLL reset generator 120 to reset all the PLLs.

Figure 20:
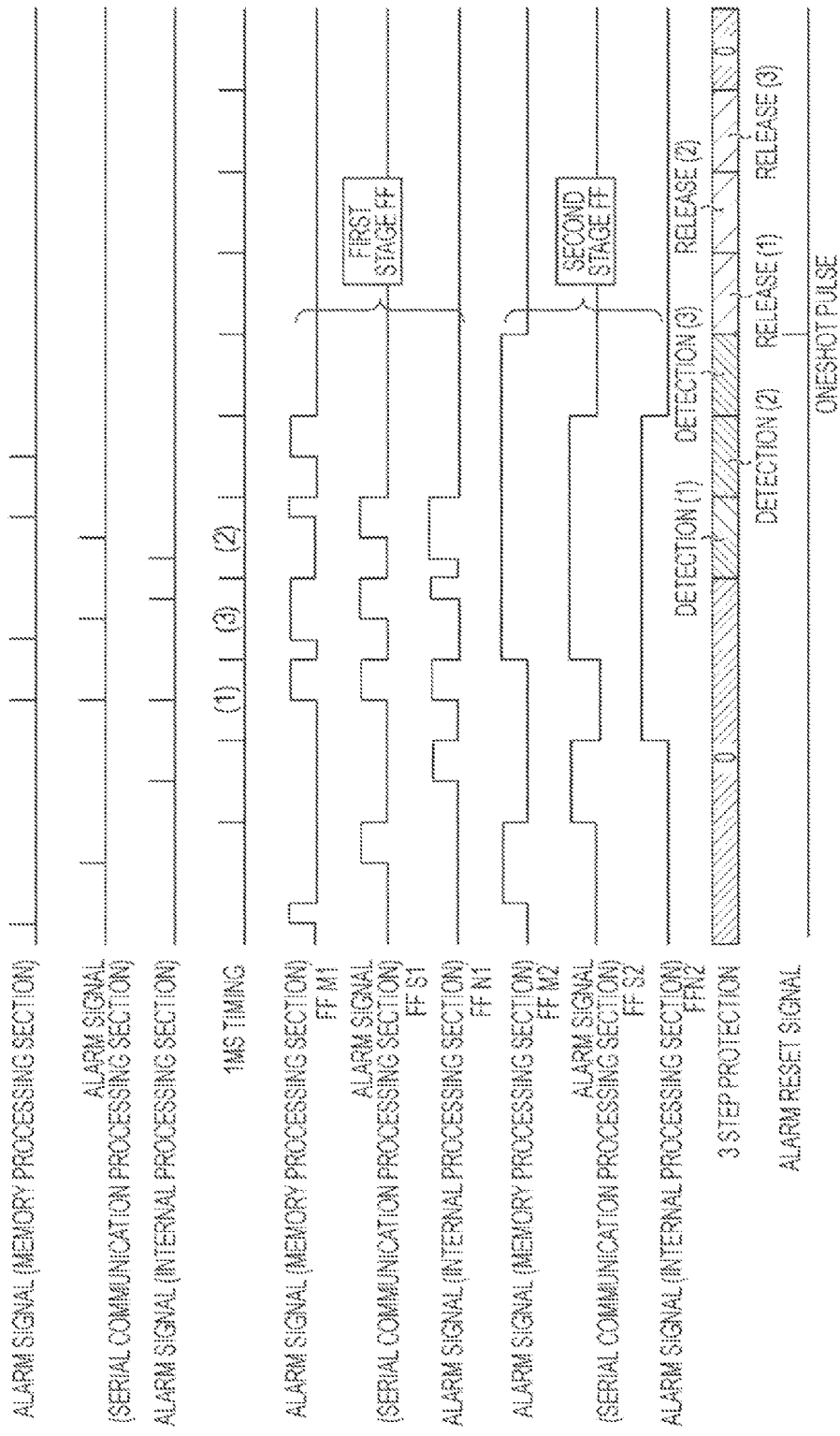
FIG. 20 illustrates a timing diagram of the processing state protection circuit.

FIG. 20 illustrates a timing diagram of the processing state protection circuit 220. Here, the alarm signals are detected in the periods (1) to (3) in the 1-ms cycle time in each of the memory processing section 230, the serial communication processing section 240 and the internal processing section 250.

Each of the alarm signals is latched in each of first-stage FFs. The alarm signals are then shifted to second-stage FFs at the next 1-ms timing. Necessity of the reset is determined on the basis of each result of AND conditions of the shifted alarm signals. Then, three consecutive protections are made at an interval of 1 ms and a one-shot reset pulse is generated. The necessity of the reset is determined when the alarm signals are input three consecutive times because it can be considered that the input of the alarm signals three consecutive times might be caused by an abnormality in the clock rather than in, for example, the memory processing section 230.

Although the alarm signals are protected in three consecutive protections and are monitored for 3 ms which corresponds to about 8 frames, an alarm detection period is not limited thereto; a period longer than a normal alarm detection period, e.g., a period longer than 5 frames, may be employed.

Supplementary Notes

The foregoing embodiment is illustrative only and the following alternatives may be available.

(1) In the described embodiment, a PLL circuit constituted by a single PLL which outputs a plurality of clocks is replaced with a PLL circuit constituted by a plurality of serially-connected PLLs each of which outputs a single clock signal. Alternatively, a PLL circuit constituted by a single PLL may be replaced with a PLL circuit constituted by another single PLL. Unlike the PLL circuit constituted by a plurality of PLLs, a PLL circuit with a single PLL is implemented without the need of consideration of a plurality of internal PLLs, but the PLLs may have different characteristics.

Figure 22:
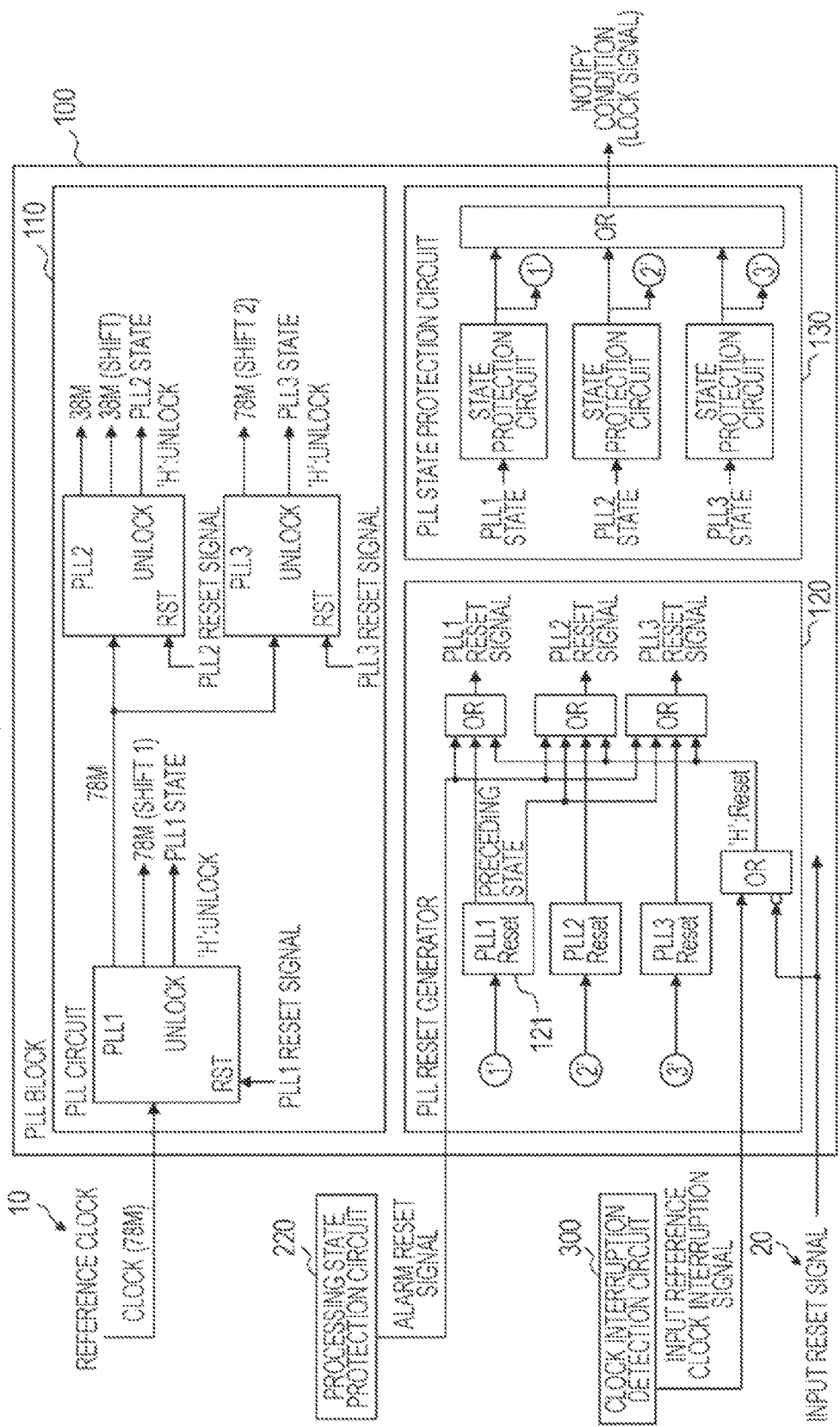
FIG. 22 illustrates an exemplary functional structure of a PLL block according to a variant example.

(2) In the described embodiment, the state signals output from each of the PLLs are input to the PLL reset generator 120. However, the state signals after being protected in the PLL state protection circuit 130 may alternatively be input to the PLL reset generator 120 as illustrated in FIG. 22. In this manner, since the PLLs are reset on the basis of the protected state signals, the possibility of occurrence of the abnormal operation due to the glitches of the state signals becomes low.

With the clock device in the described embodiment, it is possible to make a reset in a PLL circuit, which outputs a plurality of clock signals, at more appropriate times than before regardless of the characteristics of the PLL circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A clock device comprising:
   a clock circuit to generate a plurality of clock signals including a first clock signal generated by a first phase locked loop (PLL) operating based on a reference clock from an external of the clock device and a second clock signal generated by a second PLL operating based on a reference clock from the first PLL, the clock circuit including a reset part for resetting generation of the clock signals; and
   a peripheral circuit operating based on the clock signals generated from the clock circuit, the peripheral circuit including:
      an error detection part for detecting an error in a process performed in the peripheral circuit by using the clock signals, and
      a determination part for determining whether to reset the clock circuit, based on information of the error detected by the error detection part,
   wherein the reset part resets the first PLL and the second PLL when the determination part determines to reset the clock circuit, resets the second PLL when the second PLL is in an unlock state, and resets the second PLL after resetting of the first PLL when the first PLL is in the unlock state.

2. The clock device according to claim 1, wherein the determination part determines whether to reset the clock circuit, based on information of the error selected from a plurality of the errors.

3. The clock device according to claim 1, wherein the determination part determines whether to reset the clock circuit at an interval with a longer period than a detection period of the error detected by the error detection part.

4. The clock device according to claim 1, wherein the clock circuit generates the clock signals based on an external clock received, and the determination part determines to reset the clock circuit in cases where the error is detected or the error recovers after the external clock is normally received.

5. The clock device according to claim 1,
   wherein the peripheral circuit further includes:
      a receiving part for receiving data based on a first clock signal and storing the data received based on the first clock in a memory; and
      a transmitting part for reading out, based on a second clock signal generated by the clock circuit, the data stored in the memory and transmitting the data read out from the memory,
   wherein the error detection part detects the error in case where a gap between a write address for storing the data in the memory by the receiving part and a read address for reading out the data from the memory by the transmitting part, is out of a predetermined range.

6. The clock device according to claim 1, wherein the error detection part detects a data error of a serial data received by the clock device.

7. The clock device according to claim 1, wherein the reset part transmits a first reset signal for instructing to reset to the first PLL or the second PLL, and a second reset signal after the first reset signal in case where the PLL to which the first reset signal has been transmitted is in a lock state.

\* \* \* \* \*